US009786552B2

(12) United States Patent
Kim

(10) Patent No.: US 9,786,552 B2
(45) Date of Patent: Oct. 10, 2017

(54) METHODS OF FORMING FINE PATTERNS INCLUDING PAD PORTION AND LINE PORTION

(71) Applicant: SK hynix Inc., Gyeonggi-do (KR)

(72) Inventor: Do Youn Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/084,225

(22) Filed: Mar. 29, 2016

(65) Prior Publication Data

US 2017/0154809 A1 Jun. 1, 2017

(30) Foreign Application Priority Data

Nov. 27, 2015 (KR) ........................ 10-2015-0167733

(51) Int. Cl.

*H01L 21/4763* (2006.01)
*H01L 21/768* (2006.01)
*H01L 21/033* (2006.01)
*H01L 21/311* (2006.01)
*H01L 27/105* (2006.01)

(52) U.S. Cl.

CPC .... *H01L 21/76816* (2013.01); *H01L 21/0337* (2013.01); *H01L 21/31144* (2013.01); *H01L 21/76877* (2013.01); *H01L 27/105* (2013.01)

(58) Field of Classification Search

CPC ............... H01L 21/0338; H01L 21/027; H01L 21/0337; H01L 21/76816

See application file for complete search history.

(56) References Cited

U.S. PATENT DOCUMENTS

2006/0273457 A1* 12/2006 Sel ........................ H01L 27/105 257/734
2013/0307166 A1 11/2013 Doebler et al.
2014/0264893 A1* 9/2014 Pratt ..................... H01L 23/528 257/773

FOREIGN PATENT DOCUMENTS

KR 1020120081653 7/2012

* cited by examiner

*Primary Examiner* — Selim Ahmed
*Assistant Examiner* — Evan Clinton
(74) *Attorney, Agent, or Firm* — IP & T Group LLP

(57) ABSTRACT

A method of forming fine patterns includes forming a partition on a base layer. The partition includes a partition block, a first open region provided to face the partition block, and first lines extending from the partition block to the first open region. A spacer is formed on sidewalls of the partition to define a second open region overlapping with the first open region and to include second lines on sidewalls of the first lines. The partition may be removed to open a third open region occupied by the partition block and spaces between the second lines. A target pattern is formed to include third lines filling the spaces between the second lines, a first pad block filling the second open region, and a second pad block filling the third open region. Each of the first and second pad blocks is separated into a plurality of pads.

20 Claims, 38 Drawing Sheets

400 120 421 420 410 410A 110E 411 110 X X' 100 410B 130 (100) 130S

METHODS OF FORMING FINE PATTERNS INCLUDING PAD PORTION AND LINE PORTION

CROSS-REFERENCE TO RELATED APPLICATIONS

The present application claims priority under 35 U.S.C 119(a) to Korean Patent Application No. 10-2015-0167733, filed on Nov. 27, 2015, which is incorporated herein by reference in its entirety.

BACKGROUND

1. Technical Field

Various embodiments of the present disclosure relate to patterning technologies and, more particularly, to methods of forming fine patterns including a pad portion and a line portion.

2. Related Art

With the rapid growth of the semiconductor industry, a lot of effort has been focused on integration of semiconductor devices in a limited area of a semiconductor substrate. Attempts to increase the integration density of semiconductor devices have typically resulted in formation of fine patterns. Various techniques have been proposed for forming fine patterns having a nano-scale critical dimension (CD), for example, a size of from about a few nanometers to about several tens of nanometers.

Photolithography processes employed for forming the fine patterns may be limited because of image resolution limits of existing photolithography apparatuses. The image resolution limits of photolithography apparatuses relate to the wavelengths of lights generated from the light sources of the optical systems used and the resolution limit of the optical systems. Recently, double patterning (DPT) and or spacer patterning (SPT) technologies have been proposed for overcoming the resolution limits of photolithography apparatuses.

The spacer patterning technology (SPT) may be useful in the formation of arrays of repeated line/space patterns having substantially the same width. However, it may be difficult forming a line/space pattern together with a pad pattern having a different width from the line pattern of the line/space pattern using the spacer patterning technology (SPT). Thus, in order to solve the above issue, the pad pattern may be formed using an additional lithography process after the line/space pattern is formed using the spacer patterning technology (SPT). However, in such a case, an overlay error between the line/space pattern and the pad pattern may occur. When an overlay error between the line/space pattern and the pad pattern occurs while the pad pattern is formed, the pad pattern and the line/space pattern may not overlap with each other causing a failure in that the pad pattern and the line/space pattern are separated from each other. Further, when an overlay error between the line/space pattern and the pad pattern occurs while the pad pattern is formed, the pad pattern may overlap with an undesired line pattern adjacent to a desired line pattern causing a failure in that the pad pattern is electrically disconnected to the desired line pattern. Moreover, it may be difficult to accurately control a critical dimension of the pad pattern by using a lithography process for forming the pad pattern. In such a case, the pad pattern may be separated from a desired line pattern of the line/space pattern causing a failure in that the pad pattern is electrically disconnected to the desired line pattern. These failures are limitations in forming fine patterns using the spacer patterning technology (SPT).

SUMMARY

According to an embodiment, there is provided an improved method of forming fine patterns. The method includes forming a partition on a base layer. The partition is formed to include a partition block portion, a first open region provided to face the partition block portion, and a plurality of first line portions extending from a sidewall of the partition block portion toward the first open region so that ends of the first line portions are in contact with the first open region. A spacer is formed on sidewalls of the partition. The spacer is formed to include a spacer loop portion surrounding a second open region overlapping with the first open region, a plurality of second line portions disposed on both sidewalls of each of the first line portions, first connection portions disposed on sidewalls of the ends of the first line portions, and second connection portions disposed on portions of the sidewall of the partition block portion between the first line portions. The partition is removed the partition to expose a third open region corresponding to a region occupied by the partition block portion and to expose all of spaces between the second line portions. A target pattern is formed to fill regions exposed by the spacer. The target pattern is formed to include third line portions filling the spaces between the second line portions, a first pad block portion filling the second open region, and a second pad block portion filling the third open region. Each of the first and second pad block portions is separated into a plurality of pad portions.

According to another embodiment, there is provided a method of forming fine patterns. The method includes forming a hard mask layer on a base layer. A partition is formed on the hard mask layer. The partition is formed to include a partition block portion, a first open region provided to face the partition block portion, and a plurality of first line portions extending from a sidewall of the partition block portion toward the first open region so that ends of the first line portions are in contact with the first open region. A spacer is formed on sidewalls of the partition. The spacer is formed to include a spacer loop portion surrounding a second open region overlapping with the first open region, a plurality of second line portions disposed on both sidewalls of each of the first line portions, first connection portions disposed on sidewalls of the ends of the first line portions, and second connection portions disposed on portions of the sidewall of the partition block portion between the first line portions. The partition is removed to expose a third open region corresponding to a region occupied by the partition block portion and to expose all of spaces between the second line portions. A pattern feature of the spacer is transferred to the hard mask layer to form a hard mask. The hard mask is formed to expose a fourth open region overlapping with the second open region and a fifth open region overlapping with the third open region and to provide third line portions having the same planar feature as the second line portions. A target pattern is formed to fill regions exposed by the hard mask. The hard mask is formed to include fourth line portions filling spaces between the third line portions, a first pad block portion filling the fourth open region, and a second pad block portion filling the fifth open region. Each of the first and second pad block portions is separated into a plurality of pad portions.

According to another embodiment, there is provided a method of forming fine patterns. The method includes forming a partition on a base layer. The partition is formed to include a partition block portion, a first open region provided to face the partition block portion, and a plurality of first line portions extending from a sidewall of the partition block portion toward the first open region so that ends of the first line portions are in contact with the first open region. A spacer is formed on sidewalls of the partition. The spacer is formed to include a second open region overlapping with the first open region, a plurality of second line portions disposed on both sidewalls of each of the first line portions, first connection portions disposed on sidewalls of the ends of the first line portions, and second connection portions disposed on portions of the sidewall of the partition block portion between the first line portions. The partition is removed to expose a third open region corresponding to a region occupied by the partition block portion and to expose all of spaces between the second line portions. A conductive pattern is formed fill regions exposed by the spacer. The conductive pattern is formed to include third line portions filling the spaces between the second line portions, a first pad block portion filling the second open region, and a second pad block portion filling the third open region. Each of the first and second pad block portions is separated into a plurality of pad portions.

According to another embodiment, there is provided a method of forming fine patterns. The method includes forming a partition on a base layer. The partition is formed to include a partition block portion, a first open region provided to face the partition block portion, and a plurality of first line portions extending from a sidewall of the partition block portion toward the first open region so that ends of the first line portions are in contact with the first open region. A spacer is formed on sidewalls of the partition. The spacer is formed to provide a second open region overlapping with the first open region and to include second line portions on both sidewalls each of the first line portions. The partition is removed to expose a third open region corresponding to a region occupied by the partition block portion and to expose all of spaces between the second line portions. A target pattern is formed to fill regions exposed by the spacer. The target pattern is formed to include third line portions filling the spaces between the second line portions, a first pad block portion filling the second open region, and a second pad block portion filling the third open region. Each of the first and second pad block portions is separated into a plurality of pad portions.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Figure 1:
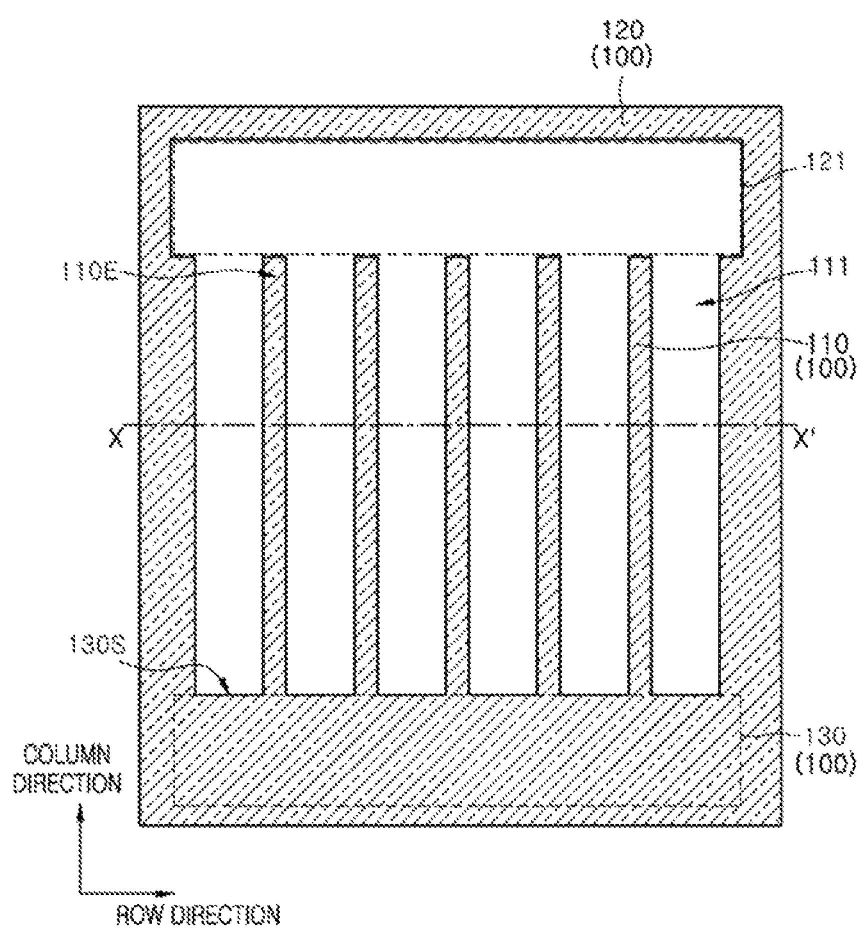
FIGS. 1 to 24 illustrate a method of forming an array of fine patterns according to an embodiment.

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms used herein have the same meaning as commonly understood by one of ordinary skill in the art to which the embodiments belong. It will be understood that although the terms first, second, third and so on may be used herein to describe various elements, these elements should not be limited by these terms. These terms are only used to distinguish one element from another element. Thus, a first element in some embodiments could be termed a second element in other embodiments without departing from the teachings of the inventive concept. It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent"). Same reference numerals refer to same elements throughout the specification. Thus, even though a reference numeral is not mentioned or described with reference to a drawing, the reference numeral may be mentioned or described with reference to another drawing. In addition, even though a reference numeral is not shown in a drawing, it may be mentioned or described with reference to another drawing.

The terminology "pattern" used herein may indicate a pattern that is formed to realize an element of an electronic circuit or an integrated circuit of a semiconductor device. The semiconductor device may be or comprise a memory device. The semiconductor device may be or comprise a logic device. The memory device may be a dynamic random access memory (DRAM) device, a static random access memory (SRAM) device, a flash memory device, a magnetic random access memory (MRAM) device, a resistive random access memory (ReRAM) device, a ferroelectric random access memory (FeRAM) device, a phase-change random access memory (PcRAM) device and the like. The semiconductor device may be employed in communication systems, such as mobile phones, electronic systems associated with biotechnology or health care, wearable electronic systems and the like.

FIGS. 1 to 24 illustrate a method of forming an array of fine patterns according to an embodiment.

Figure 2:
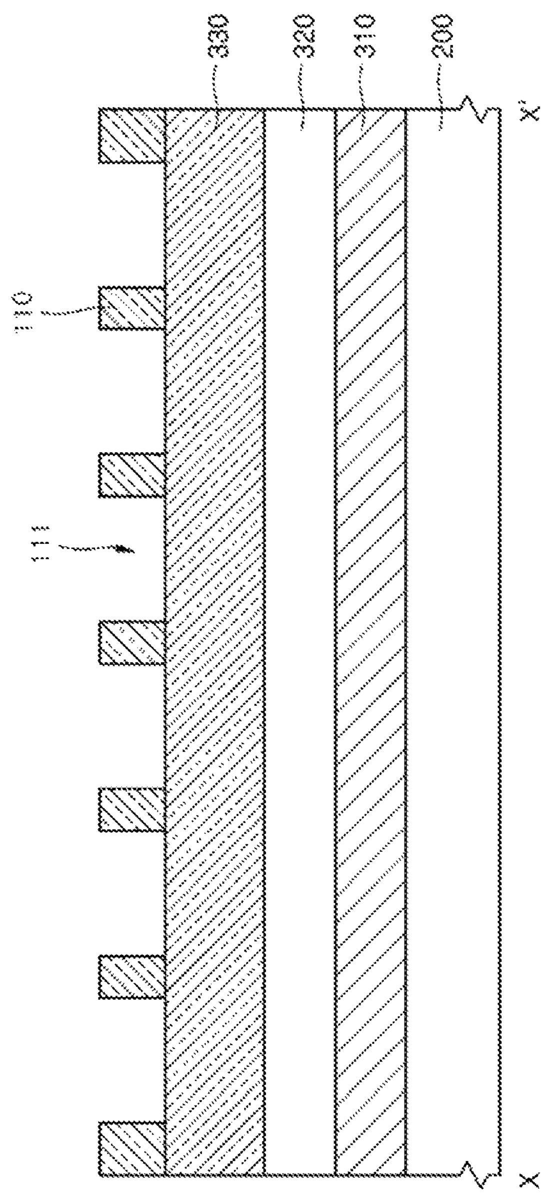

FIGS. 1 and 2 illustrate a step of forming a partition 100. FIG. 2 is a cross-sectional view taken along a line X-X' of a plan view of FIG. 1.

Referring to FIGS. 1 and 2, the partition 100 may be formed on a base layer 200 using a spacer patterning technology (SPT). The base layer 200 may be a semiconductor layer, such as a silicon layer, a semiconductor substrate, or a semiconductor wafer. Transistors constituting memory cells or peripheral circuits may be integrated in and/or on the base layer 200. An insulation substrate or a metal substrate may also be used as the base layer 200. Alternatively, the base layer 200 may be a dielectric layer such as a silicon oxide layer or a silicon nitride layer, which is formed on a semiconductor substrate (not shown).

A conductive layer 310 may be formed on the base layer 200. The conductive layer 310 may be patterned for forming interconnection lines such as bit lines in a subsequent process. The conductive layer 310 may be formed of a metal layer such as a tungsten (W) layer, a copper (Cu) layer, an aluminum (Al) layer or a titanium nitride (TiN) layer. In some embodiment, the conductive layer 310 may be formed to include a silicon material, for example, a doped polysilicon material. The conductive layer 310 may correspond to a final target layer which is finally patterned in a subsequent process. However, in some embodiments, a dielectric layer or an insulation layer instead of the conductive layer 310 may be formed on the base layer 200 to act as the final target layer.

A barrier layer 320 may be formed on the conductive layer 310. The barrier layer 320 may be formed to protect and insulate the conductive layer 310. The barrier layer 320 may be formed to include a dielectric layer, such as a silicon nitride (SiN) layer. The barrier layer 320 may be used as a capping layer that covers top surfaces of bit lines.

A hard mask layer 330 may be formed on the barrier layer 320. The hard mask layer 330 may be patterned in a subsequent process, and the patterned hard mask layer may be used as an etch mask during an etch process for patterning the barrier layer 320 or the conductive layer 310. The hard mask layer 330 may be formed of a material having an etch selectivity with respect to the barrier layer 320 and or the conductive layer 310. The hard mask layer 330 may be formed of a dielectric layer including a spin-on-carbon (SOC) layer, a silicon oxide ($SiO_2$) layer, a silicon nitride ($Si_3N_4$) layer or a silicon oxynitride (SiON) layer. A material of the hard mask layer 330 may be determined according to a material of the barrier layer 320 or the conductive layer 310.

A partition layer may be formed on the hard mask layer 330. The partition layer may be patterned using a lithography process and an etch process for forming the partition 100. The partition 100 may be formed to expose portions of the hard mask layer 330, as illustrated in FIGS. 1 and 2.

When a pattern is formed using a conventional spacer patterning technology (SPT), the pattern may be formed to have only an array of repeated line/space patterns having substantially the same width. However, the partition 100 of FIG. 1 may be formed to have a partition block portion 130 in addition to the line/space pattern.

The partition block portion 130 corresponding to a portion of the partition 100 may be formed to occupy a region having a rectangular plane shape. That is, the partition block portion 130 may be formed to have a band shape extending in a horizontal direction parallel with a row direction. Accordingly, a dimension of the partition block portion 130 in the horizontal direction may be greater than a dimension of the partition block portion 130 in a vertical direction parallel with a column direction.

A first open region 121 may be defined at a position that is spaced apart from the partition block portion 130 in the vertical direction. The first open region 121 may be sized to expose a portion of the underlying layer (i.e., the hard mask layer 330). The first open region 121 may correspond to an empty space region that is not occupied by the partition 100. The first open region 121 may be surrounded by a partition frame portion 120 corresponding to a portion of the partition 100.

The first open region 121 may define an empty space region of the partition 100 having a rectangular plane shape. That is, the first open region 121 may have a band shape extending in a horizontal direction parallel with a row. Accordingly, a dimension of the first open region 121 in the horizontal direction may be greater than a dimension of the first open region 121 in the vertical direction.

Each of the first open region 121 and the partition block portion 130 may define a region in which a plurality of pad portions are formed in a subsequent process. The plurality of pad portions may be formed to extend from line portions that are disposed in a region between the first open region 121 and the partition block portion 130 and may be formed to have a dimension which is greater than a dimension of the line portions. At least two of the pad portions may be consecutively arranged in each of the first open region 121 and the partition block portion 130. The first open region 121 and the partition block portion 130 may have substantially the same layouts and may be disposed to face each other. The partition frame portion 120 of the partition 100 may be formed to have a loop shape surrounding the first open region 121. The first open region 121 may have a layout that is a reverse image of the partition block portion 130 of the partition 100.

The first open region 121 may be spaced apart from the partition block portion 130 by a certain distance and may be disposed to face the partition block portion 130 in the vertical direction intersecting the line X-X' of FIG. 1 at a right angle. The partition 100 may include a plurality of first line portions 110 disposed between the partition block portion 130 and the first open region 121. The plurality of first line portions 110 may extend from a sidewall 130S of the partition block portion 130 toward the first open region 121, and ends 110E of the first line portions 110 opposite to the partition block portion 130 may contact the first open region 121. The plurality of first line portions 110 may be spaced apart at regular intervals along the horizontal direction and may be extending in the vertical direction in parallel to each other. Space regions 111 may be provided in the intervals between the first line portions 110. A width, i.e. a dimension in the horizontal direction, of the space regions 111 may be set to be substantially three times a width of the first line portions 110. The partition frame portion 120 of the partition 100 may extend from the partition block portion 130 to surround a region in which the first line portions 110 are disposed. That is, the partition frame portion 120 may have a loop structure that surrounds the first open region 121 and the first line portions 110. The partition block portion 130 and the first line portions 110 may be disposed to have a comb-shaped structure.

The partition 100 may have a relatively complex layout that includes the partition block portion 130 having different width and shape from the first line portions 110 in addition to the first line portions 110 and the space regions 111 between the first line portions 110.

The partition 100 may be formed using an advanced lithography process exhibiting a high image resolution, for example, an immersion photolithography process with an argon fluoride (ArF) light source in order to realize fine patterns corresponding to the complex layout. In addition, since a width of the space regions 111 is greater than a width of the first line portions 110, the partition 100 may be formed using a dark tone photomask (not shown) to obtain accurate patterns of the first line portions 110.

The partition 100 may be formed of one of various materials having an etch selectivity with respect to the underlying layer (i.e., the hard mask layer 330). The partition 100 may be formed to include a different dielectric material from the underlying layer, that is, the hard mask layer 330. For example, the partition 100 may be formed of a dielectric layer including a spin-on-carbon (SOC) layer, a silicon oxide ($SiO_2$) layer, a silicon nitride ($Si_3N_4$) layer or a silicon oxynitride (SiON) layer. Alternatively, the partition 100 may be formed of a material including a silicon material, such as a polysilicon material.

Figure 3:
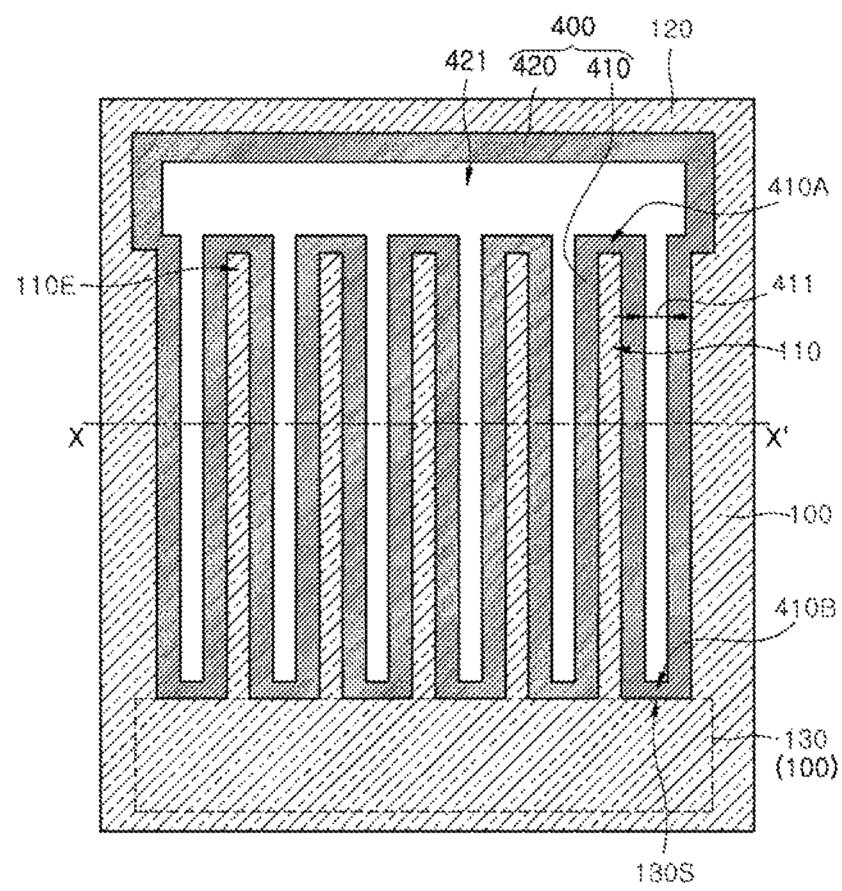
Figure 4:
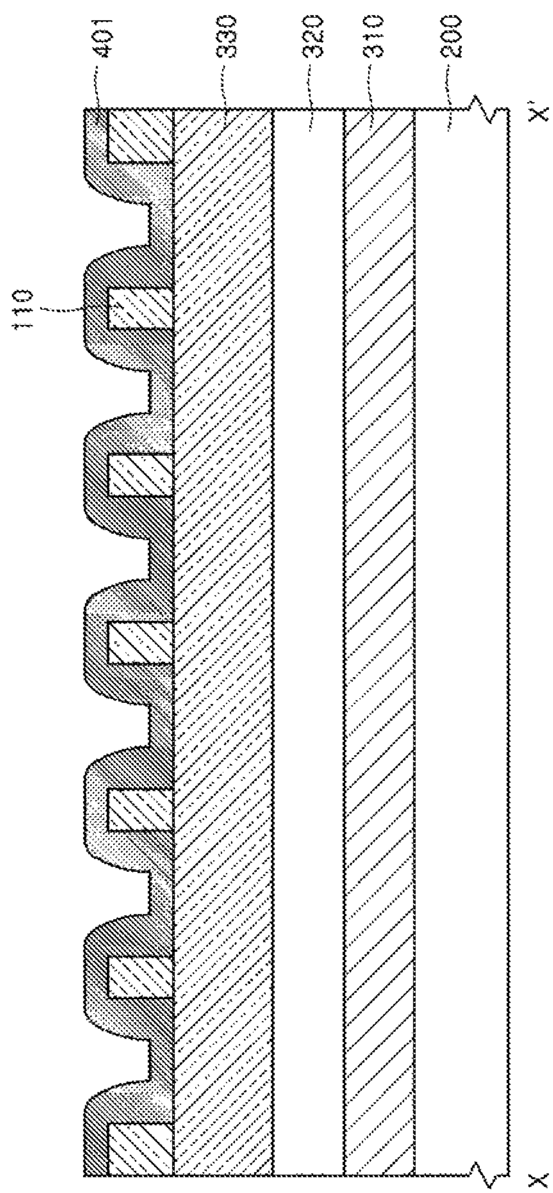
Figure 5:
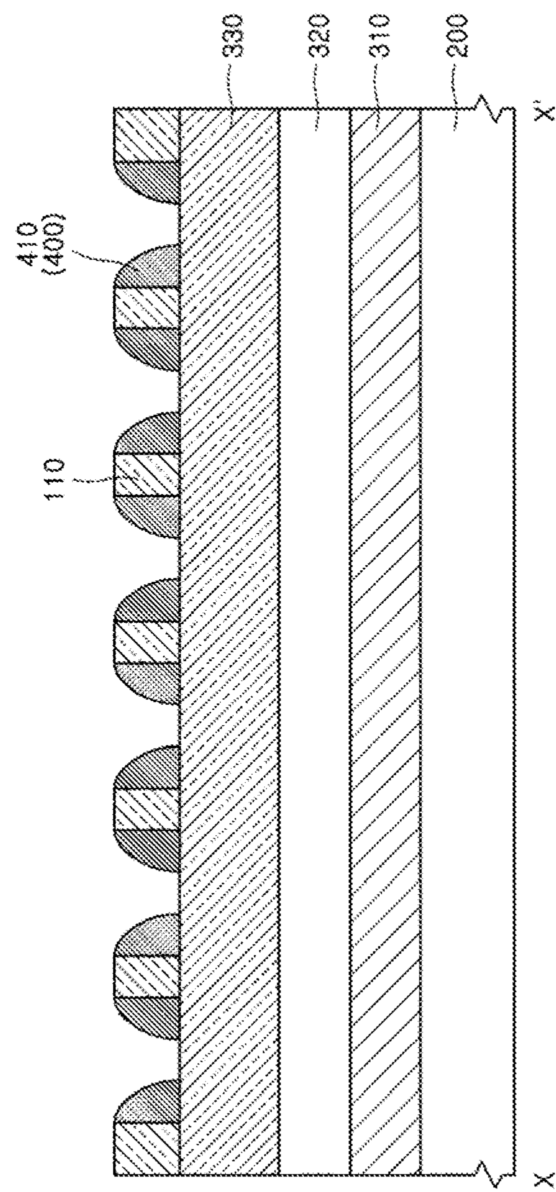

FIGS. 3 to 5 illustrate a step of forming a spacer 400. FIGS. 4 and 5 are cross-sectional views taken along a line X-X' of a plan view shown in FIG. 3.

Referring to FIGS. 3 to 5, the spacer 400 may be formed on sidewalls of the partition 100. Specifically, a spacer layer 401 may be formed to cover the partition 100 and portions of the hard mask layer 330 exposed by the partition 100. The spacer layer 401 may be formed to have a surface profile which is substantially consistent with a surface morphology of the partition 100. The spacer layer 401 may be formed of a material having an etch selectivity with respect to the partition 100 and the underlying hard mask layer 330. The spacer layer 401 may be formed of a material which is different from the partition 100 and the underlying hard mask layer 330. When the spacer layer 401 is formed of a different material from the partition 100 and the underlying hard mask layer 330, the spacer layer 401 may be formed of a dielectric material including a spin-on-carbon (SOC) layer, a silicon oxide ($SiO_2$) layer, a silicon nitride ($Si_3N_4$) layer or a silicon oxynitride (SiON) layer. Alternatively, the spacer layer 401 may be formed of a material including a silicon material, such as a polysilicon material. In some embodiments, the spacer layer 401 may be formed to include an ultra-low temperature oxide (ULTO) layer.

The spacer layer 401 illustrated in FIG. 4 may be anisotropically etched for forming the spacer 400 that remains on sidewalls of the partition 100 and that exposes a top surface of the partition 100 and portions of the hard mask layer 330, as illustrated in FIG. 5.

Referring again to FIG. 3, since the spacer 400 is formed on the sidewalls of the partition 100, the spacer 400 may have a layout conformant to the sidewalls of the partition 100. Hence, the spacer 400 may include a spacer loop portion 420 formed on inner sidewalls of the partition frame portion 120 defining the first open region 121. The spacer loop portion 420 may define a second open region 421 overlapping with the first open region 121. The spacer 400 may further include second line portions 410 formed on sidewalls of the first line portions 110. In addition, the spacer 400 may further include first connection portions 410A formed on sidewalls of the ends 110E of the first line portions 110 and second connection portions 410B formed on portions of the sidewall 130S between the first line portions 110. Space regions 411 narrower than the space regions 111 may be provided between the second line portions 410.

The spacer 400 may include a folded line portion that is comprised of the first connection portions 410A, the second connection portions 410B and the second line portions 410 to have a tooth-shaped layout. The first connection portions 410A may be spaced apart from each other at regular intervals in the horizontal direction parallel with the line X-X' of FIG. 3. The second connection portions 410B may also be spaced apart from each other at regular intervals in the horizontal direction parallel with the line X-X' of FIG. 3. The first connection portions 410A may be disposed not to be aligned with the second connection portions 410B in the vertical direction intersecting the line X-X' of FIG. 3. That is, the first connection portions 410A may be offset along the horizontal direction relative to the second connection portions 410B. Accordingly, the first connection portions 410A, the second connection portions 410B and the second line portions 410 may be connected to each other in series to constitute a folded line having a tooth-shape. As a result, the spacer 400 may have a closed loop shape in a plan view.

Figure 6:
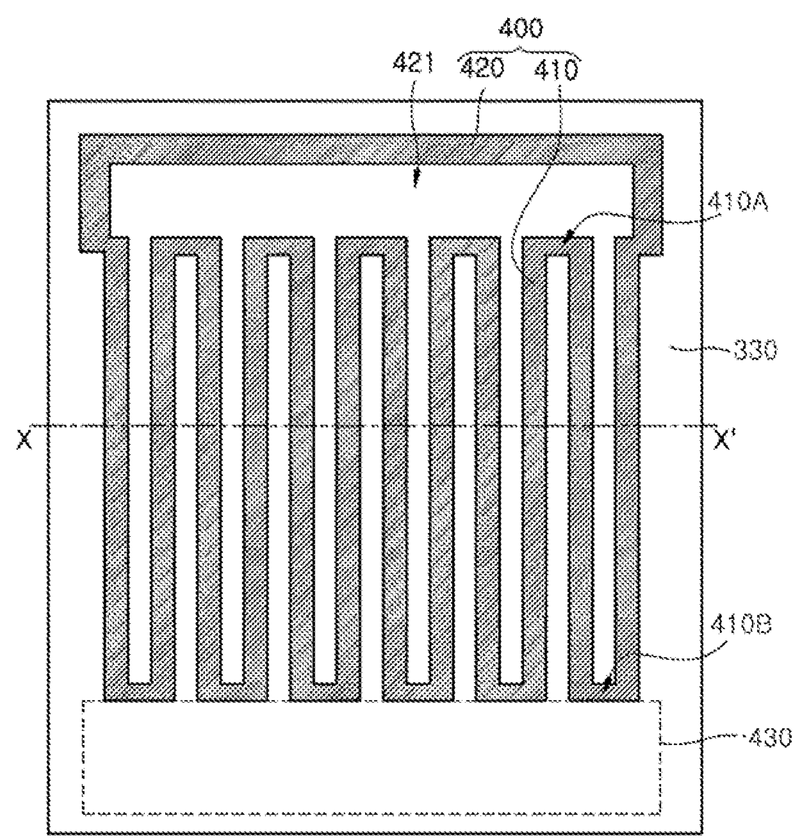
Figure 7:
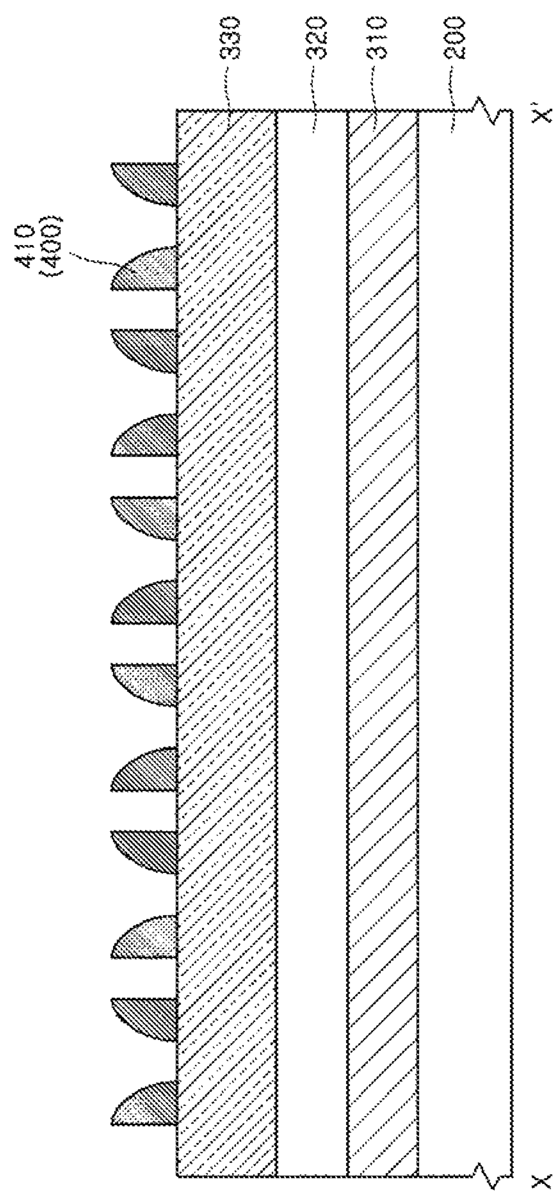

FIGS. 6 and 7 illustrate a step of exposing outer sidewalls of the spacer 400. FIG. 7 is a cross-sectional view taken along a line X-X' of a plan view shown in FIG. 6.

Referring to FIGS. 6 and 7, the partition 100 may be selectively removed to expose outer sidewalls of the spacer 400. The partition 100 may be removed by selectively etching the partition 100 having an etch selectivity with respect to the spacer 400 and the hard mask layer 330. While the partition 100 is removed, the partition block portion 130 of the partition 100 may be removed to provide a third open region 430. The third open region 430 may correspond to a region that was occupied by the partition block portion 130.

Figure 8:
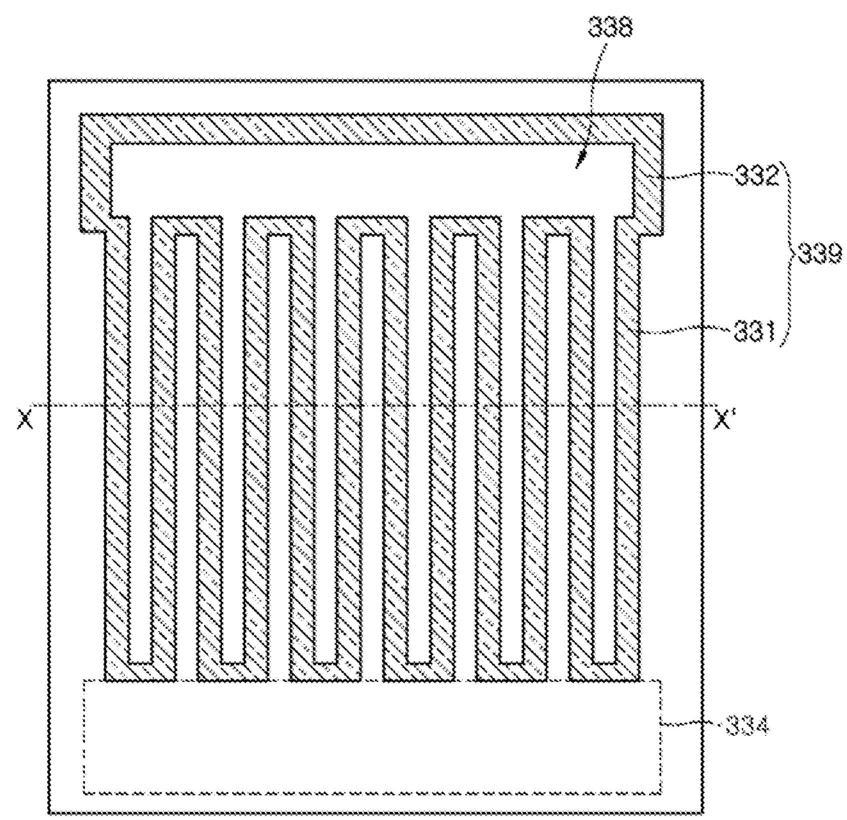
Figure 9:
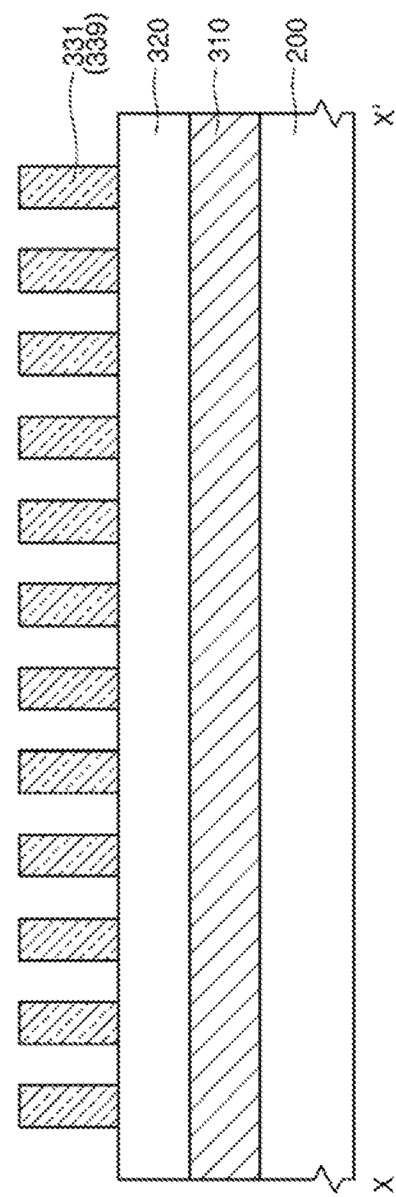

FIGS. 8 and 9 illustrate a step of forming a hard mask 339. FIG. 9 is a cross-sectional view taken along a line X-X' of a plan view shown in FIG. 8.

Referring to FIGS. 8 and 9, a pattern layout of the spacer 400 may be transferred to the hard mask layer 330 for forming the hard mask 339. Specifically, the hard mask layer 330 may be etched by an anisotropic etch process employing the spacer 400 as an etch mask, thereby forming the hard mask 339. As a result, the hard mask 339 may be formed to have substantially the same planar layout as the spacer 400. The hard mask 339 may be formed to include a hard mask loop portion 332 surrounding a fourth open region 338 corresponding to a transfer region of the second open region 421 and to include third line portions 331 corresponding to transfer patterns of the second line portions 410. After the hard mask 339 is formed, a fifth open region 334 corresponding to a transfer region of the third open region 430 may be provided. After the hard mask 339 is formed, the spacer 400 may be removed.

The hard mask 339 may act as an etch mask for improving an etch selectivity while the underlying layers are patterned in a subsequent process. If the hard mask 339 is not provided, the spacer 400 may act as an etch mask while the underlying layers are patterned in a subsequent process. In such a case, an etch process for patterning the underlying layers may exhibit a poor etch selectivity. The hard mask 339 may be formed to have substantially the same planar outlay as the spacer 400.

Figure 10:
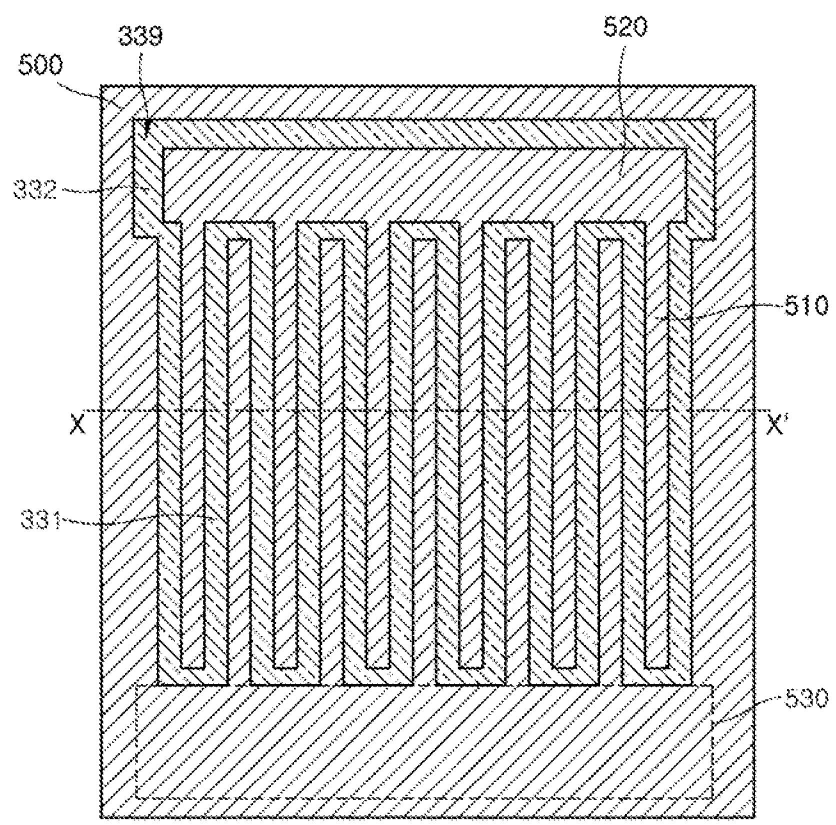
Figure 11:
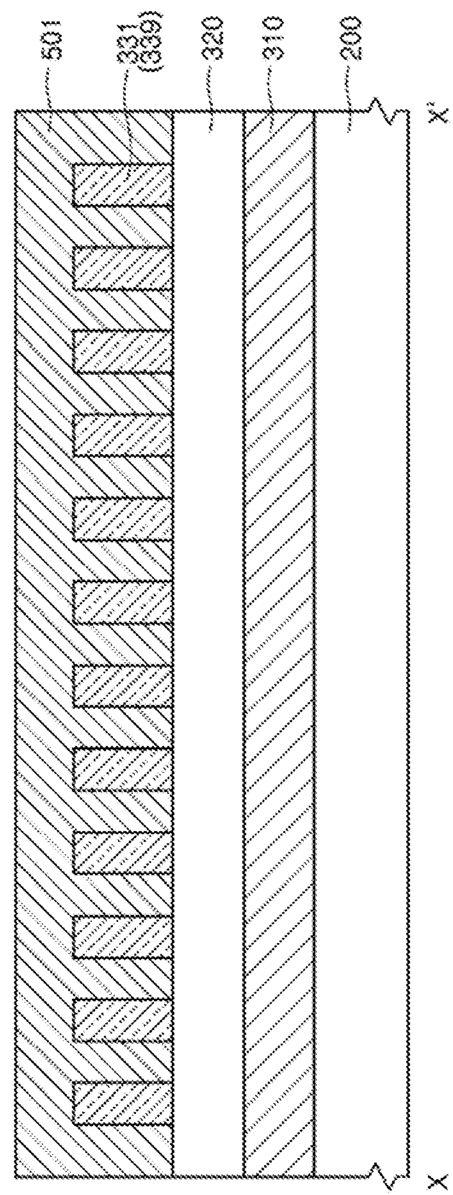
Figure 12:
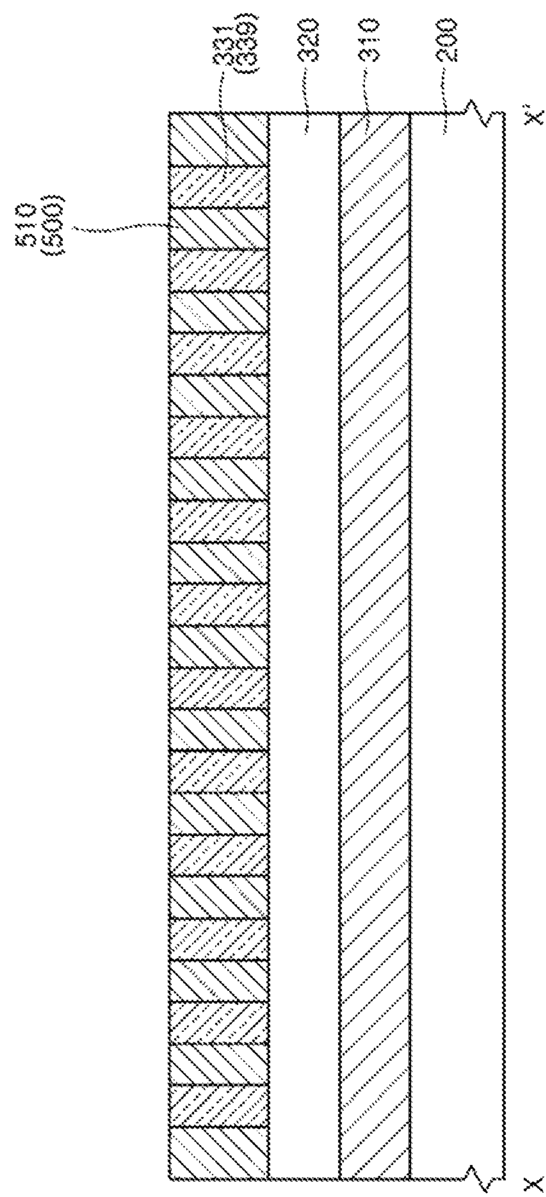

FIGS. 10 to 12 illustrate a step of forming a target pattern 500 filling open regions defined by the hard mask 339. FIGS. 11 and 12 are cross-sectional views taken along a line X-X' of a plan view shown in FIG. 10.

Referring to FIGS. 10 and 11, the target pattern 500 may be formed to fill the open regions defined by the hard mask 339. Thus, the target pattern 500 may have an outlay that is a reverse image of the hard mask 339. Specifically, a target layer 501 may be formed to cover an entire portion of the hard mask 339 and portions of the underlying barrier layer 320 exposed by the hard mask 339. The target layer 501 may be formed of a material layer having an etch selectivity with respect to the hard mask 339 and the underlying barrier layer 320. The target layer 501 may be formed of a material layer which is different from the hard mask 339 and the underlying barrier layer 320. When the target layer 501 is formed of a different material layer from the hard mask 339 and the underlying barrier layer 320, the target layer 501 may be formed of a dielectric material including a spin-on-carbon (SOC) layer, a silicon oxide ($SiO_2$) layer, a silicon nitride ($Si_3N_4$) layer or a silicon oxynitride (SiON) layer. Alternatively, the target layer 501 may be formed of a material including a silicon material, such as a polysilicon material. In some embodiments, the target layer 501 may be formed of a conductive material.

As illustrated in FIG. 12, the target layer 501 may be recessed until a top surface of the hard mask 339 is exposed. As a result, the target pattern 500 may be formed in a plurality of inside regions surrounded by the hard mask 339 and in an outside region surrounding the hard mask 339. The target layer 501 may be recessed using a planarization process such as an etch-back process or a chemical mechanical polishing (CMP) process. Since the target pattern 500 is formed to fill the space region surrounded by the hard mask 339, the target pattern 500 may have a shape that is the reverse image of the hard mask 339.

The target pattern 500 may be formed to include fourth line portions 510 filling space regions between the third line portions 331 of the hard mask 339, a first pad block portion 520 filling the fourth open region 338 surrounded by the hard mask loop portion 332 of the hard mask 339, and a second pad block portion 530 filling the fifth open region 334. Each of the first and second pad block portions 520 and 530 may be divided into a plurality of pad portions in a subsequent process. A width of each of the fourth line portions 510 in the horizontal direction may be less than a width of each of the first and second pad block portions 520 and 530 in the vertical direction.

Since the hard mask 339 is formed to have substantially the same planar layout as the spacer 400, the process for forming the hard mask layer 330 may be omitted when the spacer 400 has a sufficiently high etch selectivity to act as an excellent etch mask or an excellent template for forming the target pattern 500. In such a case, the target pattern 500 may be formed in an inside region surrounded by the spacer 400 and in an outside region of the spacer 400, and thus the target pattern 500 may be formed using the spacer 400 as a template. Meanwhile, the hard mask 339 may be formed of a multi-layered material to increase an etch selectivity thereof.

Figure 13:
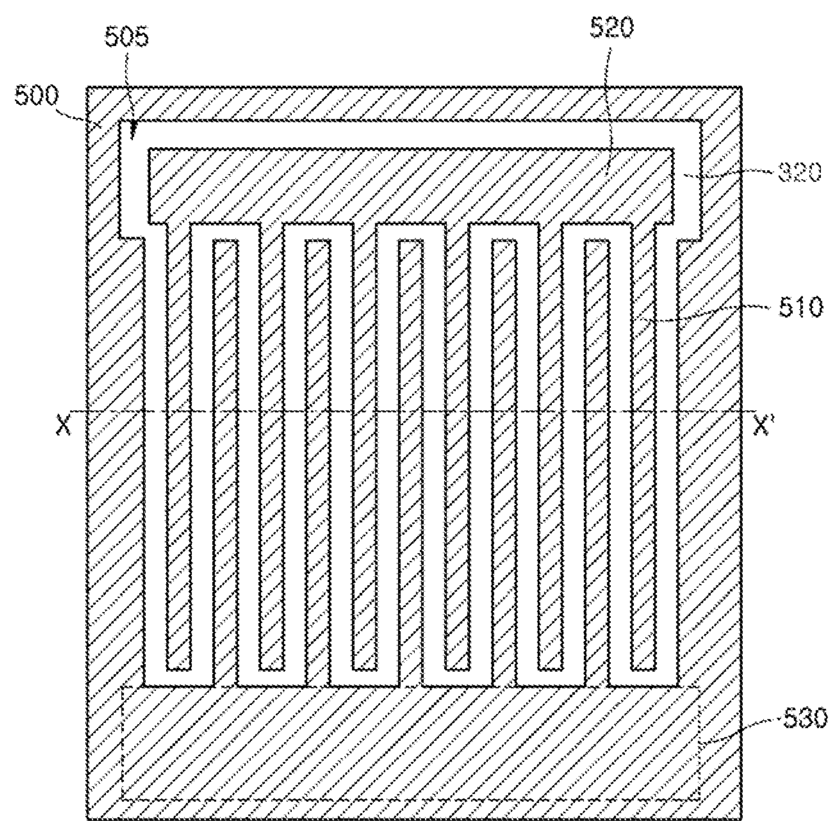
Figure 14:
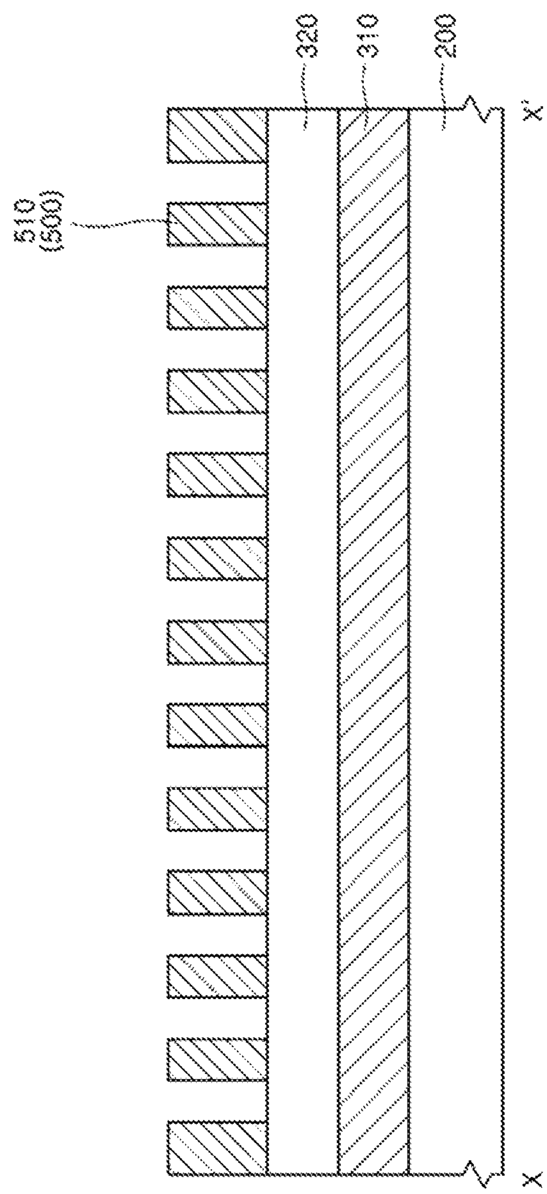
Figure 15:
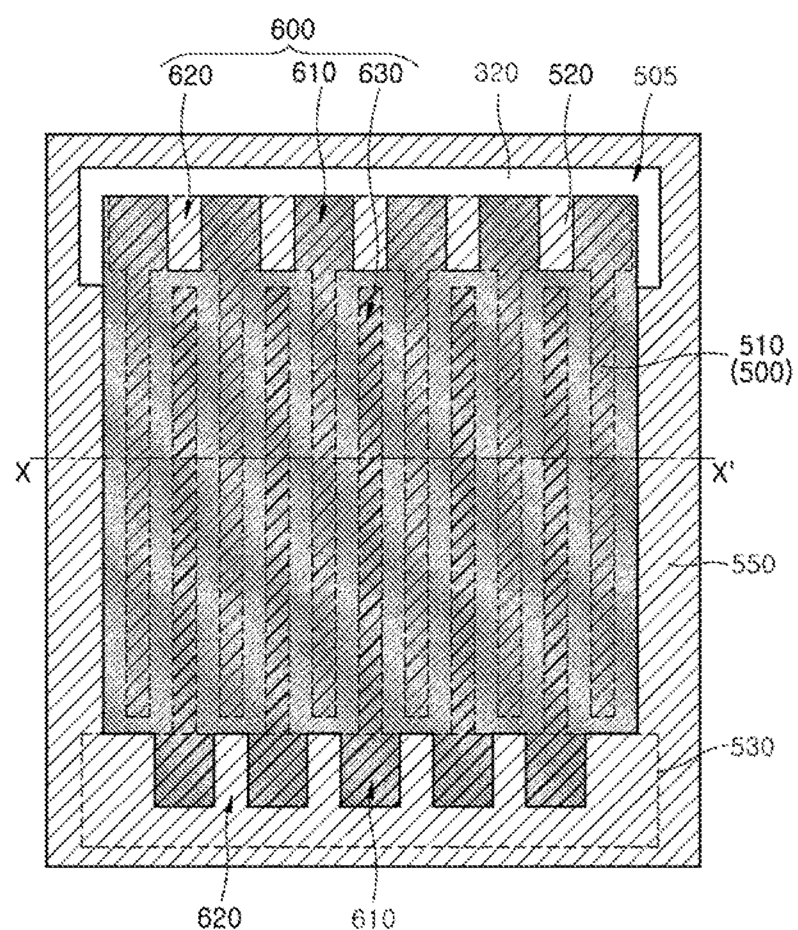
Figure 16:
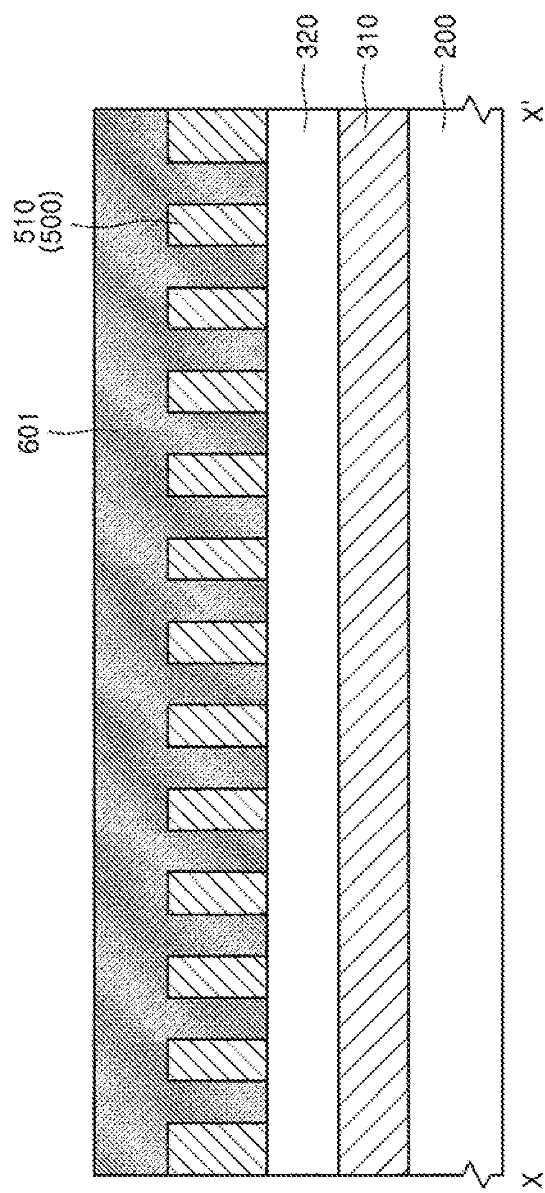

FIGS. 13 and 14 illustrate a step of exposing sidewalls of the target pattern 500. FIG. 14 is a cross-sectional view taken along a line X-X' of a plan view shown in FIG. 13.

Referring to FIGS. 13 and 14, the hard mask 339 may be selectively removed to expose sidewalls of the target pattern 500 and a portion of the underlying barrier layer 320. The hard mask 339 may be removed to provide a trench 505. The hard mask 339 may be selectively etched and removed using an etch selectivity of the hard mask 339 with respect to the target pattern 500 and the underlying barrier layer 320.

When the target pattern 500 is formed using the spacer 400 as a template without formation of the hard mask layer 330, a portion of the underlying barrier layer 320 may be exposed by selectively removing the spacer 400.

FIGS. 15 to 19 illustrate a step of forming a cut mask 600. FIGS. 16 to 19 are cross-sectional views taken along a line X-X' of a plan view shown in FIG. 15.

Figure 17:
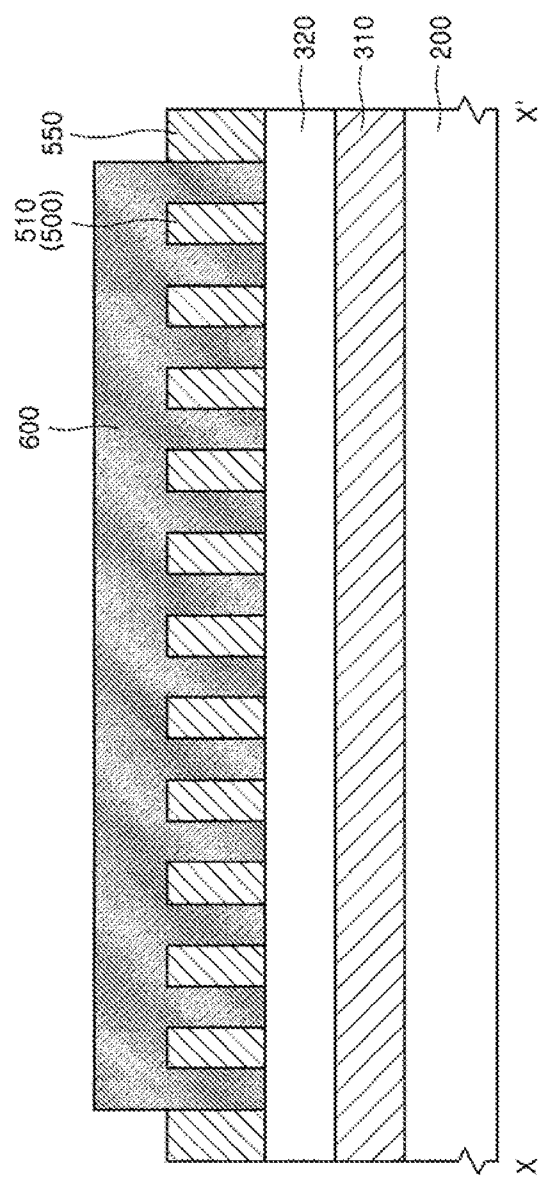
Figure 18:
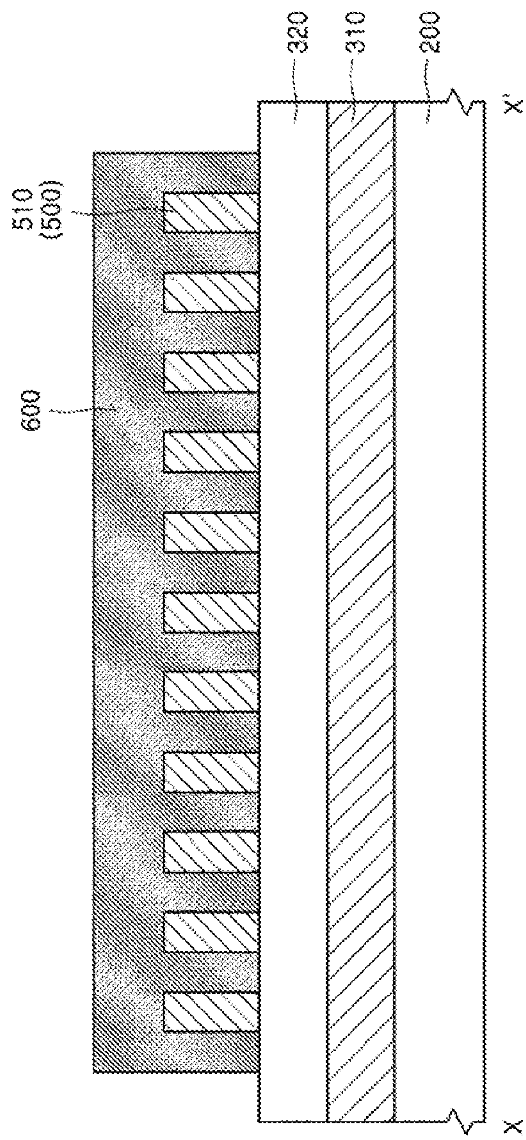
Figure 19:
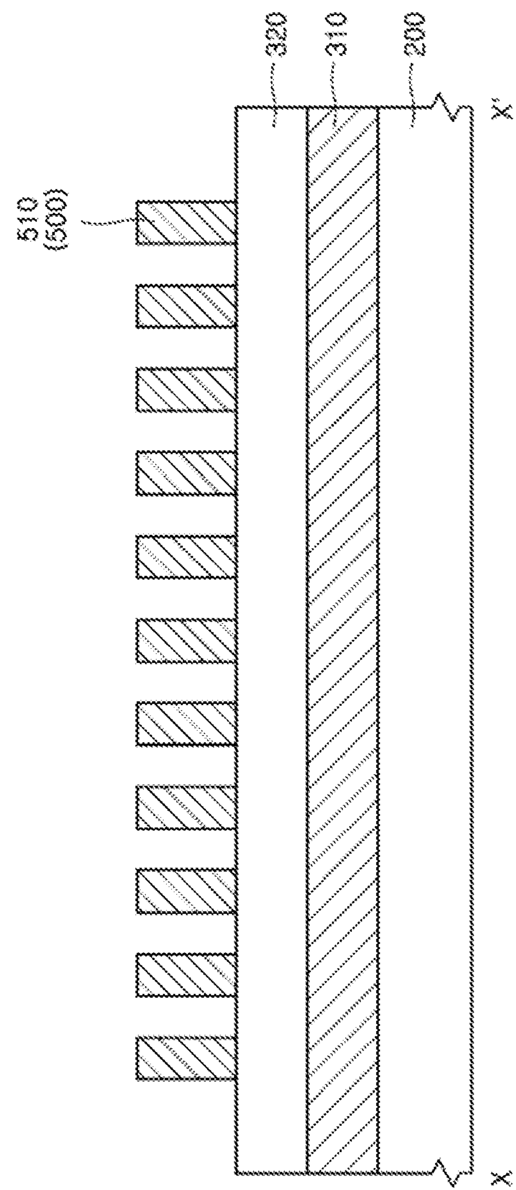

Referring to FIGS. 15 to 19, the cut mask 600 may be formed on the target pattern 500 to expose some portions of the target pattern 500. The cut mask 600 may be formed to include a line/space region 630 that covers the fourth line portions 510 of the target pattern 500 and space regions between the fourth line portions 510. In addition, the cut mask 600 may be formed to include open regions 620 exposing some portions of the first and second pad block portions 520 and 530, and include some portions 610 covering the other portions of the first and second pad block portions 520 and 530. The some portions 610 of the cut mask 600 may define pad portions. The cut mask 600 may be formed by coating a photoresist layer 601 on the target pattern 500 to fill the trench 505 (see FIG. 16), by selectively exposing some portions of the photoresist layer 601, and by developing the exposed photoresist layer 601 for forming a photoresist pattern corresponding to the cut mask 600 (see FIG. 17). As illustrated in FIGS. 17 and 18, when portions 550 of the target pattern 500 exposed by the cut mask 600 are selectively removed, the fourth line portions 510 may remain. Thus, the fourth line portions 510 may still remain during a subsequent pad separation process performed using the cut mask 600.

Figure 20:
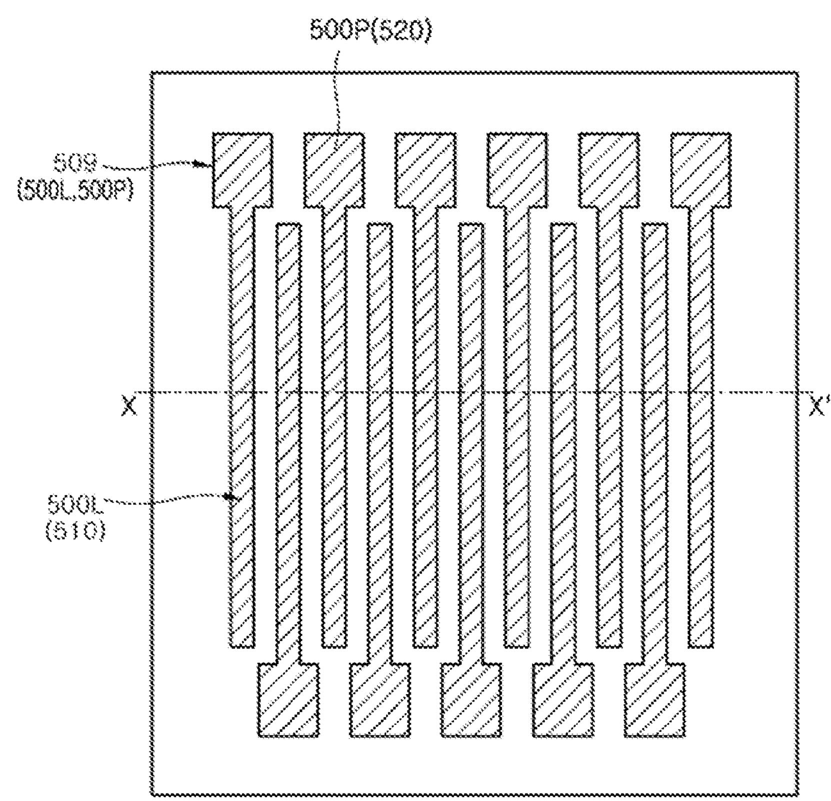
Figure 21:
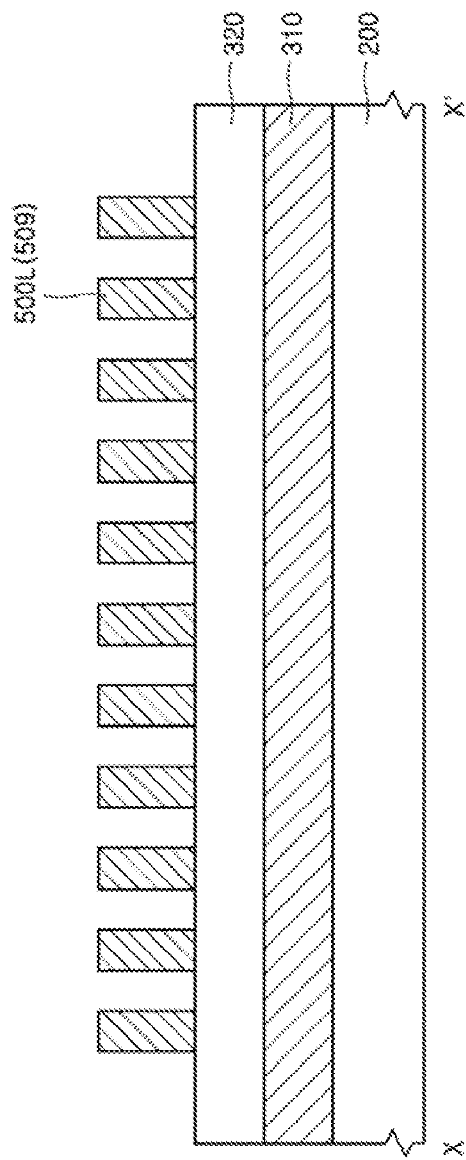

FIGS. 20 and 21 illustrate pad separation target patterns 509. FIG. 21 is a cross-sectional view taken along a line X-X' of a plan view shown in FIG. 20.

Referring to FIGS. 20 and 21, the portions of the target pattern 500 exposed by the cut mask 600 may be selectively etched using the cut mask 600 as an etch mask, thereby separating each of the first and second pad block portions 520 and 530 into a plurality of pad portions 500P. Since the cut mask 600 is formed to cover the fourth line portions 510 and the space regions between the fourth line portions 510, the fourth line portions 510 may not be removed to provide line portions 500L which are respectively connected to the pad portions 500P during the etch process for separating each of the first and second pad block portions 520 and 530 into the plurality of pad portions 500P. As a result, the pad separation target patterns 509 may be formed by etching the target pattern 500 using the cut mask 600 as an etch mask. Also, each of the pad separation target patterns 509 may include one of the pad portions 500P and one of the line portions 500L, which are connected to each other. Each of the pad portions 500P may be connected to only one end of a corresponding line portion 500L. The pad portions 500P formed of the first pad block portion 520 may be connected to odd-numbered line portions among the line portions 500L, respectively. The pad portions 500P formed of the second pad block portion 530 may be connected to even-numbered line portions among the line portions 500L, respectively. A width of each of the line portions 500L in a horizontal direction intersecting the line portions 500L may be less than a width of each of the pad portions 500P in the horizontal direction.

Since the line/space region 630 of the cut mask 600 is connected to the portions 610 of the cut mask 600, occurrence of open failures between the line portions 500L and the pad portions 500P may be prevented during the pad separation process performed using the cut mask 600 as an etch mask. The cut mask 600 may be removed after the pad separation target patterns 509 are formed, as shown for instance in FIG. 21.

Figure 22:
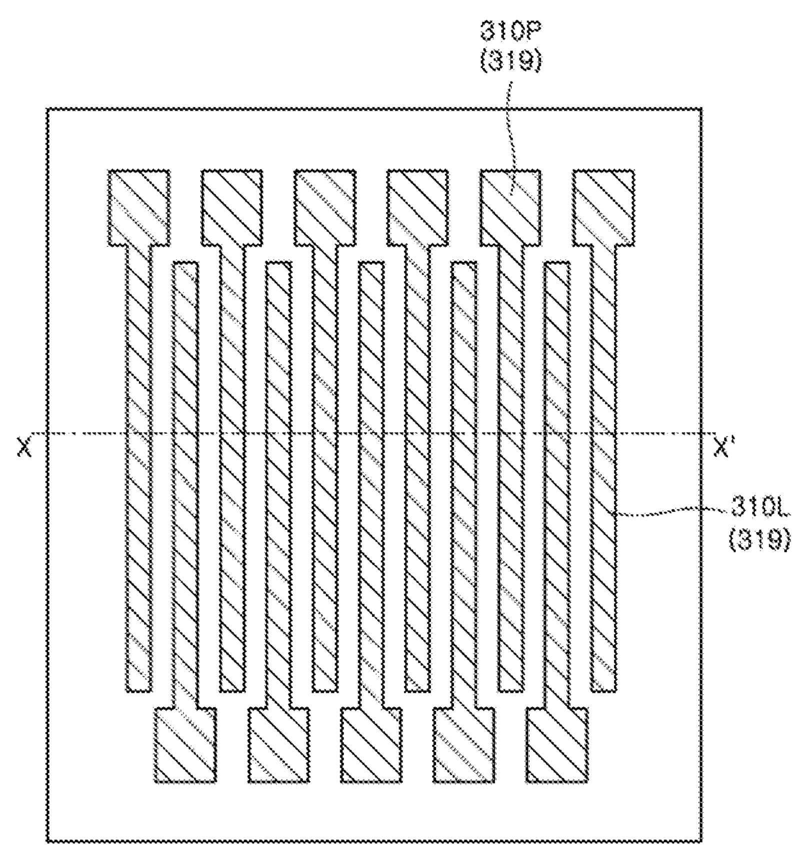
Figure 23:
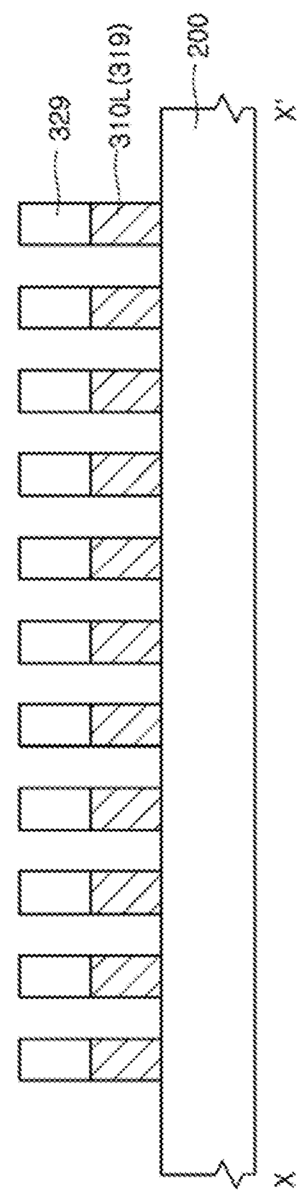

FIGS. 22 and 23 illustrate a step of forming conductive patterns 319 having the same planar layout as the pad separation target patterns 509. FIG. 23 is a cross-sectional view taken along a line X-X' of a plan view shown in FIG. 22.

Referring to FIGS. 22 and 23, a pattern layout of the pad separation target patterns 509 may be transferred to the underlying barrier layer 320 and the underlying conductive layer 310. Specifically, the barrier layer 320 and the conductive layer 310 may be etched successively using the pad separation target patterns 509 as etch masks, thereby forming barrier patterns 329 and conductive patterns 319. Each of the conductive patterns 319 may be formed to include a conductive line portion 310L having the same planar layout as a corresponding line portion of the line portions 500L of the pad separation target patterns 509 and a conductive pad portion 310P having the same planar layout as a corresponding pad portion of the pad portions 500P of the pad separation target patterns 509. The barrier patterns 329 may overlap with the conductive patterns 319, respectively. The conductive patterns 319 may correspond to final target patterns.

Figure 24:
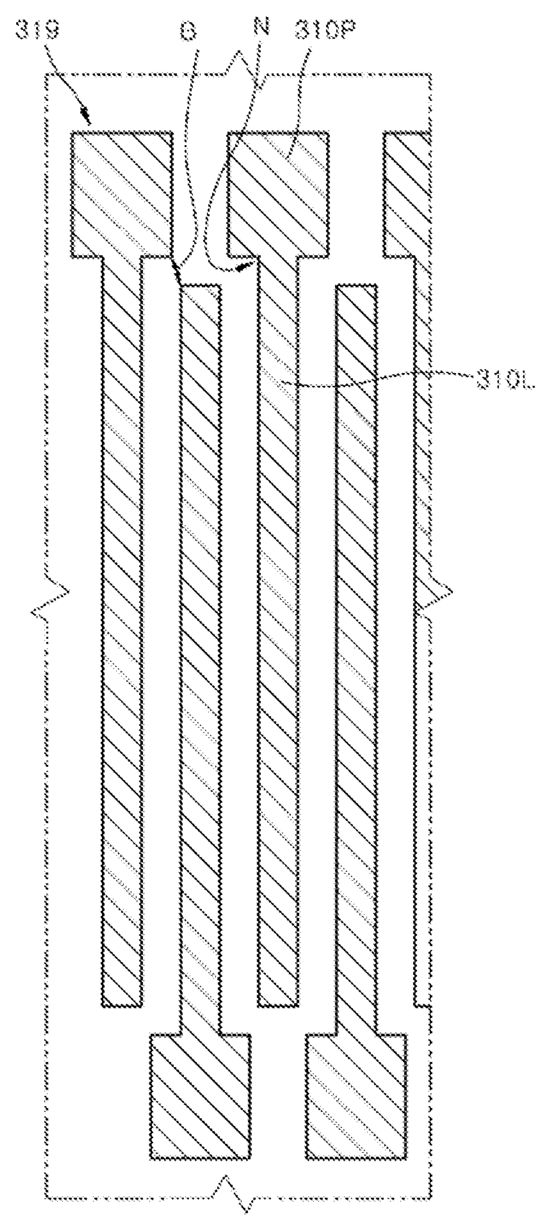

FIG. 24 is a partial plan view illustrating the conductive patterns 319 in detail.

Referring to FIG. 24, the conductive pad portions 310P and the conductive line portions 310L may be formed by patterning the conductive layer 310. Since the first and second pad block portions 520 and 530 and the line portions 510 of the target pattern 500 are simultaneously formed by a single patterning process, a necking phenomenon of connection portions N between the conductive pad portions 310P and the conductive line portions 310L may be prevented. In addition, a distance B between a conductive pad portion 310P and an adjacent conductive line portion 310L may correspond to a distance between the first pad block portion 520 and ends of the line portions 510 connected to the second pad block portion 530 (or a distance between the second pad block portion 530 and ends of the line portions 510 connected to the first pad block portion 520). The distance B between the first pad block portion 520 (or the second pad block portion 530) and ends of the line portions 510 may be determined by the partition 100. Thus, the distance B between the first pad block portion 520 (or the second pad block portion 530) and ends of the line portions 510 may not be affected by an overlay between the cut mask 600 and the target pattern 500. Accordingly, formation of bridges may be prevented between the first conductive pad portions 310P formed under the first pad block portion 520 (or the second conductive pad portions 310P formed under the second pad block portion 530) and the conductive line portions 310L connected to the second conductive pad portions 310P (or the conductive line portions 310L connected to the first conductive pad portions 310P) regardless of the overlay between the cut mask 600 and the target pattern 500.

FIGS. 25 to 38 illustrate a method of forming an array of fine patterns according to another embodiment.

Figure 25:
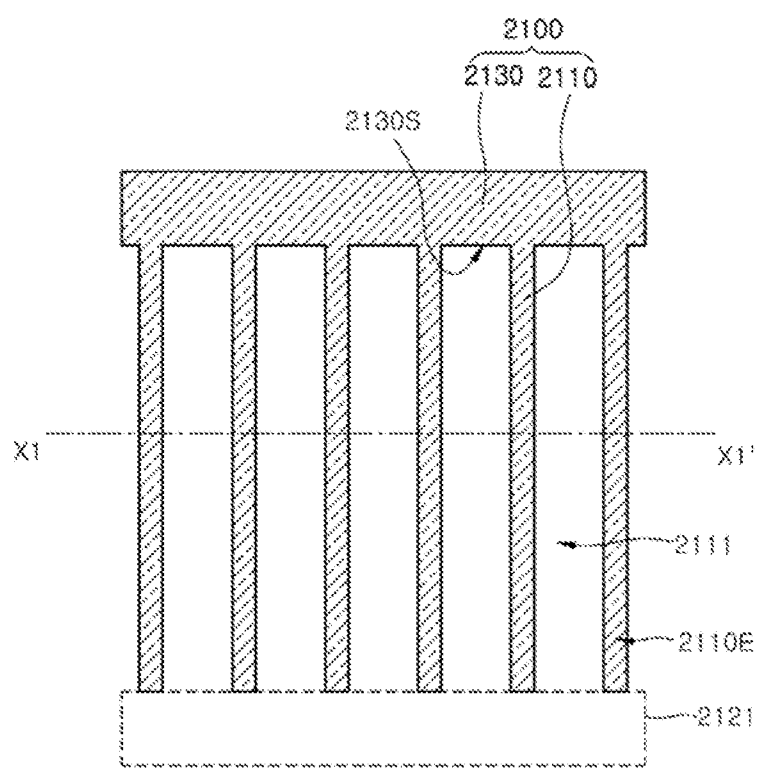
FIGS. 25 to 38 illustrate a method of forming an array of fine patterns according to another embodiment.
Figure 26:
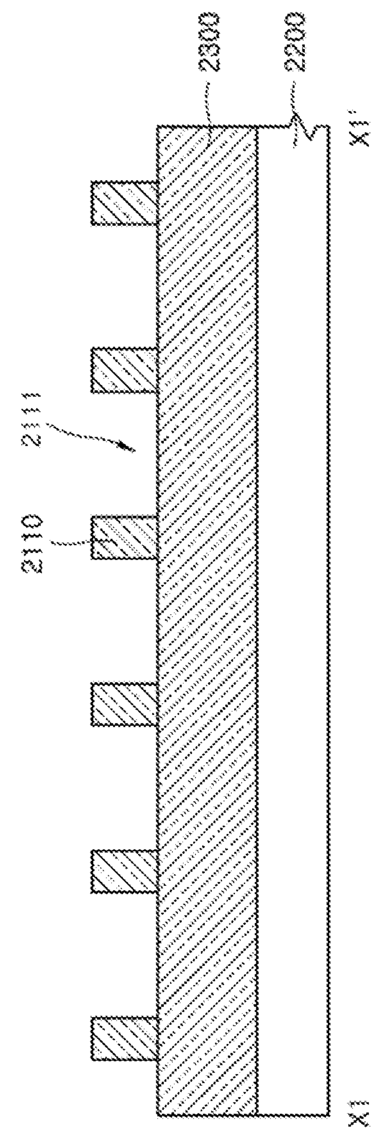

FIGS. 25 and 26 illustrate a step of forming a partition 2100. FIG. 26 is a cross-sectional view taken along a line X-X' of a plan view shown in FIG. 25.

Referring to FIGS. 25 and 26, the partition 2100 may be formed on a base layer 2200 using a spacer patterning technology (SPT). A hard mask layer 2300 may be formed on the base layer 2100. The hard mask layer 2300 may be formed of a dielectric layer including a spin-on-carbon (SOC) layer, a silicon oxide ($SiO_2$) layer, a silicon nitride ($Si_3N_4$) layer or a silicon oxynitride (SiON) layer. Alternatively, the hard mask layer 2300 may be formed of a material including a silicon material, such as a polysilicon material.

A partition layer may be formed on the hard mask layer 2300, and the partition layer may be patterned using a lithography process and an etch process for forming the partition 2100. The partition 2100 may be formed to expose portions of the hard mask layer 2300, as illustrated in FIGS. 25 and 26.

When a pattern is formed using a conventional spacer patterning technology (SPT), the pattern may be formed to have only an array of repeated line/space patterns having substantially the same width. However, the partition 2100 of FIG. 25 may be formed to have a partition block portion 2130 in addition to the line/space pattern.

The partition block portion 2130 corresponding to a portion of the partition 2100 may be formed to occupy a region having a rectangular plane shape. That is, the partition block portion 2130 may be formed to have a band shape extending in a horizontal direction parallel with a row. Accordingly, a dimension of the partition block portion 2130 in the horizontal direction may be greater than a dimension of the partition block portion 2130 in a vertical direction parallel with a column.

A first open region 2121 may be defined at a position that is spaced apart from the partition block portion 2130 in the vertical direction. The first open region 2121 may be defined to expose a portion of the underlying layer (i.e., the hard mask layer 2300). The first open region 2121 may correspond to an empty space region that is not occupied by the partition 2100. The first open region 2121 may be surrounded by a partition frame portion (not shown) corresponding to a portion of the partition 2100.

Each of the first open region 2121 and the partition block portion 2130 may define a region in which a plurality of pad portions are formed in a subsequent process. The plurality of pad portions may be formed to extend from line portions that are disposed in a region between the first open region 2121 and the partition block portion 2130 and may be formed to have a width which is greater than a width of the line portions. At least two of the pad portions may be consecutively arranged in each of the first open region 2121 and the partition block portion 2130. The first open region 2121 and the partition block portion 2130 may have substantially the same shape and may be disposed to face each other. The first open region 2121 may have a layout that is a reverse image of a layout of the partition block portion 2130 of the partition 2100.

The first open region 2121 may be spaced apart from the partition block portion 2130 by a certain distance and may be disposed to face the partition block portion 2130 in the vertical direction intersecting the line X-X' of FIG. 25 at a right angle. The partition 2100 may include a plurality of first line portions 2110 disposed between the partition block portion 2130 and the first open region 2121. The plurality of first line portions 2110 may extend from a sidewall 2130S of the partition block portion 2130 toward the first open region 2121, and ends 2110E of the first line portions 2110 opposite to the partition block portion 2130 may contact the first open region 2121. The plurality of first line portions 2110 may be spaced apart from each other at regular intervals along the horizontal direction and may extend along the vertical direction in parallel with each other. Space regions 2111 may be provided between the first line portions 2110. A width of the space regions 2111 may be set to be substantially three times a width of the first line portions 2110. The partition block portion 2130 and the first line portions 2110 may be disposed to have a comb-shaped shape.

The partition 2100 may be formed of one of various materials having an etch selectivity with respect to the underlying layer (i.e., the hard mask layer 2300). The partition 2100 may be formed to include a different dielectric material from the underlying layer, that is, the hard mask layer 2300. For example, the partition 2100 may be formed of a dielectric layer including a spin-on-carbon (SOC) layer, a silicon oxide ($SiO_2$) layer, a silicon nitride ($Si_3N_4$) layer or a silicon oxynitride (SiON) layer. Alternatively, the partition 2100 may be formed of a material including a silicon material, such as a polysilicon material.

Figure 27:
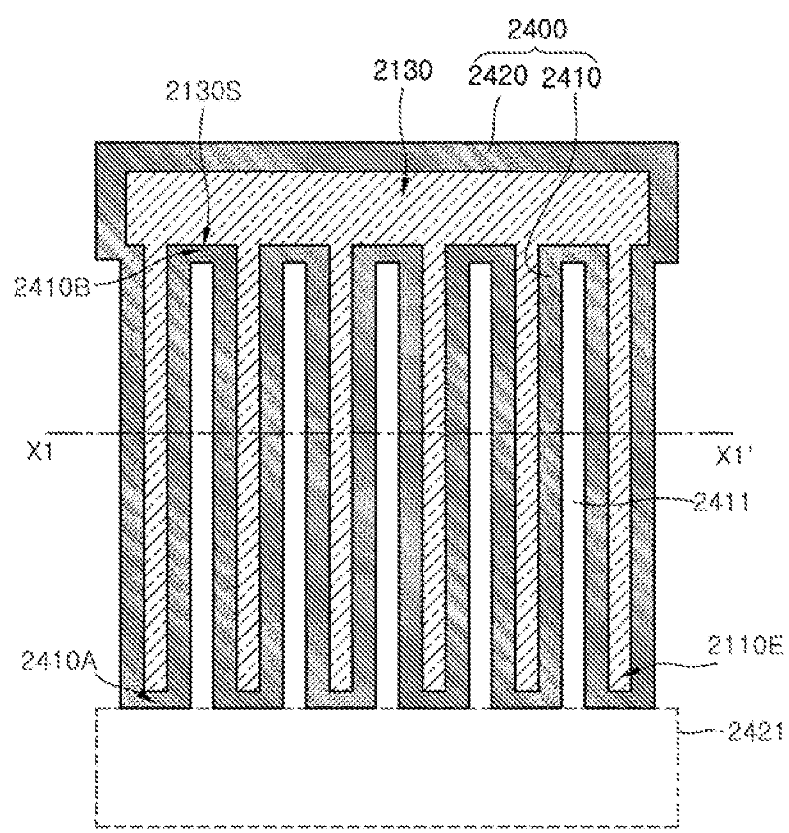
Figure 28:
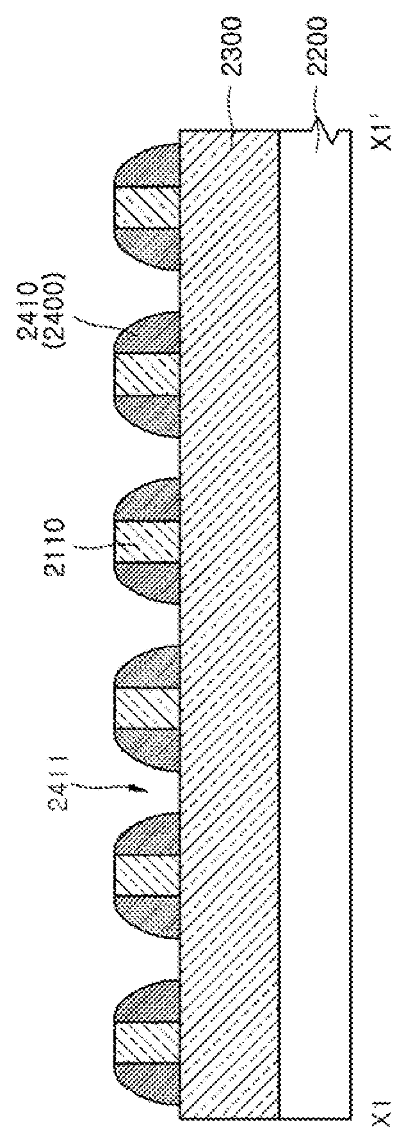

FIGS. 27 and 28 illustrate a step of forming a spacer 2400. FIG. 28 is a cross-sectional view taken along a line X-X' of a plan view shown in FIG. 27.

Referring to FIGS. 27 to 28, the spacer 2400 may be formed on sidewalls of the partition 2100. Specifically, a spacer layer may be formed to cover the partition 2100 and portions of the hard mask layer 2300 exposed by the partition 2100. The spacer layer may be formed to have a surface profile which is substantially consistent with a surface morphology of the partition 2100. The spacer layer may be anisotropically etched for forming the spacer 2400 that remains on sidewalls of the partition 2100 and that exposes a top surface of the partition 2100 and portions of the hard mask layer 2300. In some embodiments, the spacer layer may be formed to include an ultra-low temperature oxide (ULTO) layer.

Since the spacer is formed on the sidewalls of the partition 2100, the spacer may have a layout conformant to the sidewalls of the partition 2100. The spacer 2400 may include a spacer loop portion 2420 surrounding the partition block portion 2130. The spacer 2400 may further include second line portions 2410 formed on sidewalls of the first line portions 2110. In addition, the spacer 2400 may further include first connection portions 2410A formed on sidewalls of the ends 2110E of the first line portions 2110 and second connection portions 2410B formed on portions of the sidewall 2130S between the first line portions 2110. Space regions 2411 narrower than the space regions 2111 may be provided between the second line portions 2410. The spacer 2400 may be formed to define a second open region 2421 overlapping with the first open region 2121.

The spacer 2400 may include a folded line portion that is comprised of the first connection portions 2410A, the second connection portions 2410B and the second line portions 2410 to have a tooth-shaped shape. The first connection portions 2410A may be spaced apart from each other in the horizontal direction parallel with the line X-X' of FIG. 27. The second connection portions 2410B may also be disposed to be spaced apart from each other in the horizontal direction parallel with the line X-X' of FIG. 27. The first connection portions 2410A may be disposed not to be aligned with the second connection portions 2410B in the vertical direction intersecting the line X-X' of FIG. 27. That is, the first connection portions 2410A may be offset along the horizontal direction relative to the second connection portions 2410B. Accordingly, the first connection portions 2410A, the second connection portions 2410B and the second line portions 2410 may be connected to each other in series to constitute a folded line having a tooth-shaped shape. As a result, the spacer 2400 may have a closed loop shape in a plan view.

Figure 29:
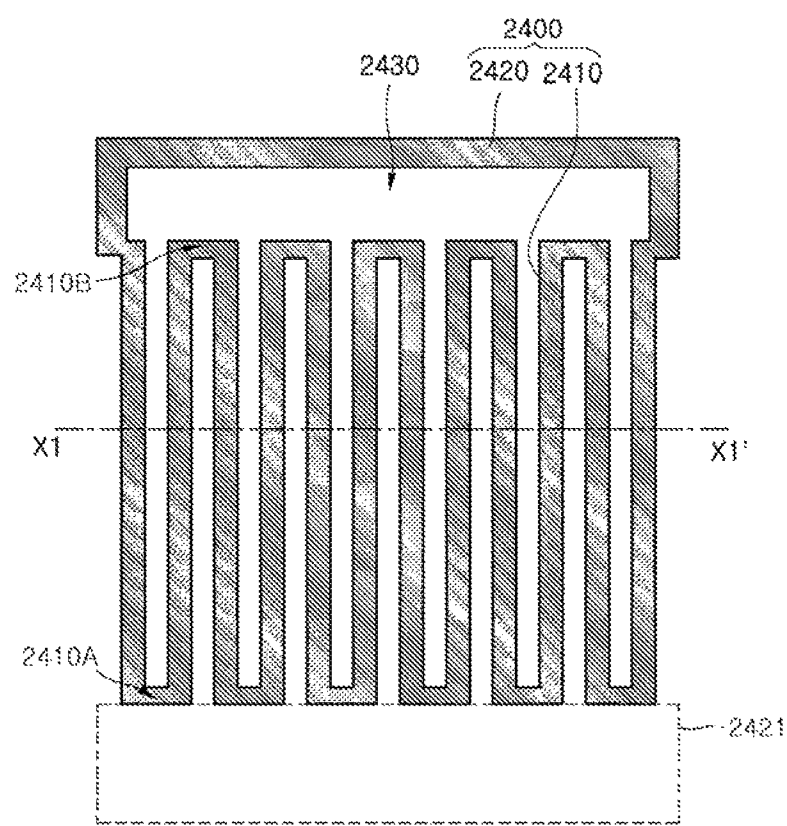
Figure 30:
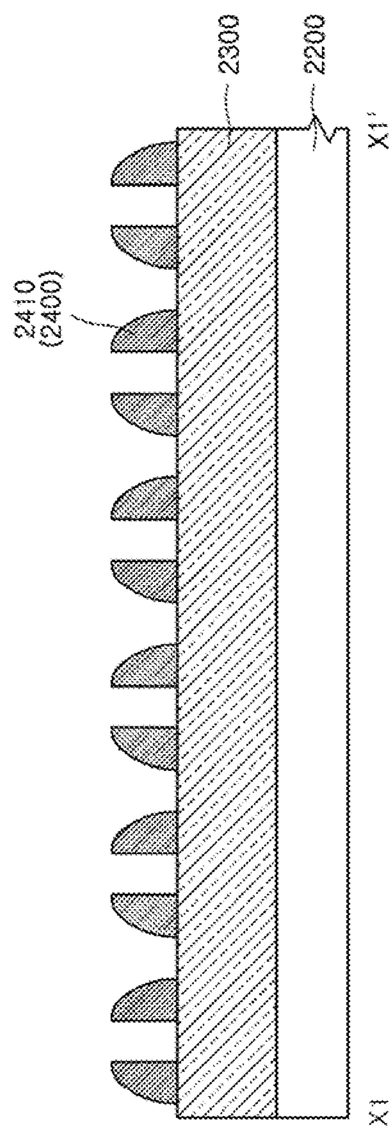

FIGS. 29 and 30 illustrate a step of exposing inner sidewalls of the spacer 2400. FIG. 30 is a cross-sectional view taken along a line X-X' of a plan view shown in FIG. 29.

Referring to FIGS. 29 and 30, the partition 2100 may be selectively removed to expose inner sidewalls of the spacer 2400. While the partition 2100 is removed, the partition block portion 2130 of the partition 2100 may be removed to provide a third open region 2430. The third open region 2430 may correspond to a region that is occupied by the partition block portion 2130.

Figure 31:
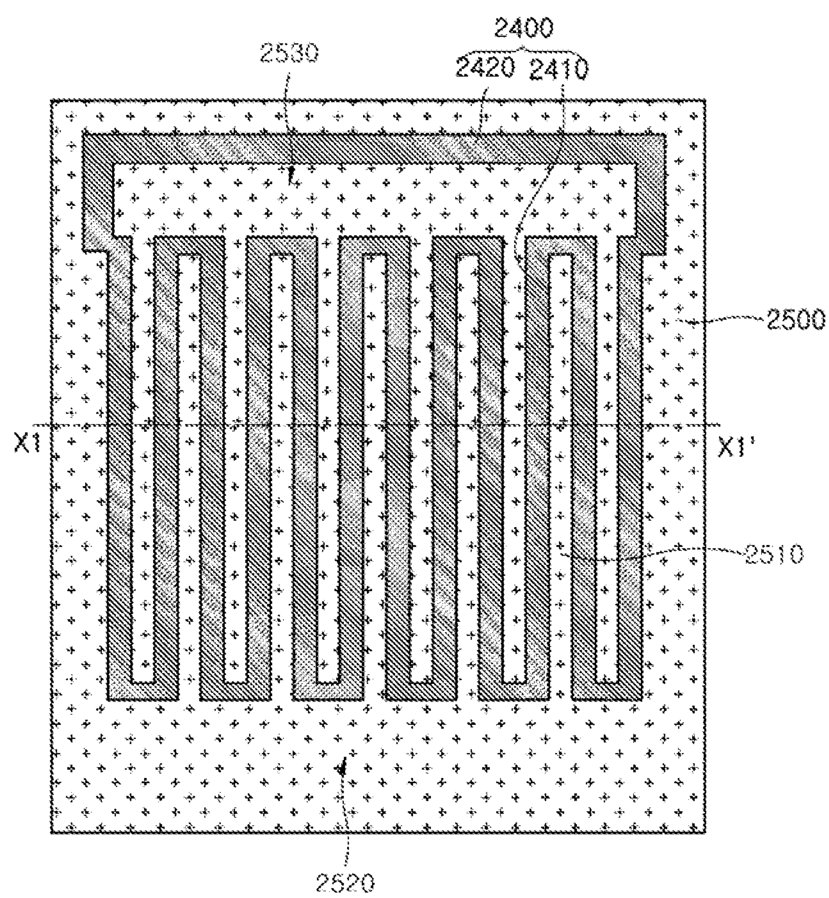
Figure 32:
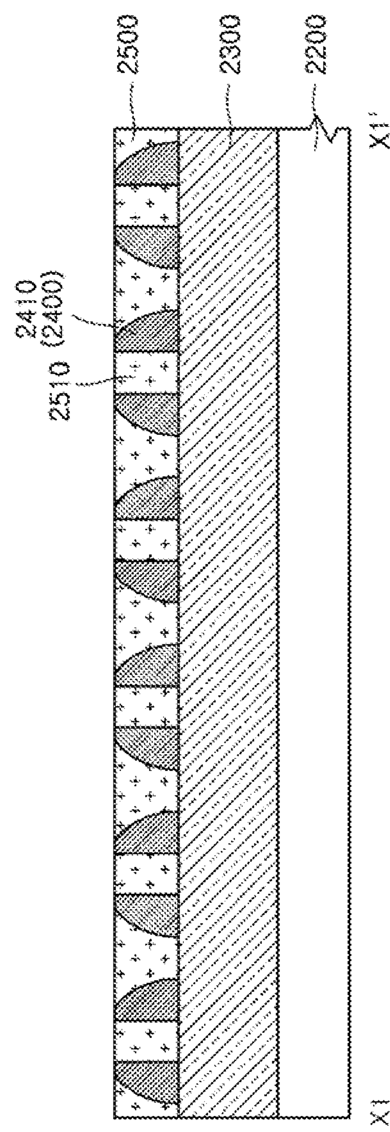

FIGS. 31 to 32 illustrate a step of forming a target pattern 2500 filling open regions defined by the spacer 2400. FIG. 32 is a cross-sectional views taken along a line X-X' of a plan view shown in FIG. 31.

Referring to FIGS. 31 and 32, the target pattern 2500 may be formed to fill the open regions defined by the spacer 2400. Thus, the target pattern 2500 may have a reverse image of the spacer 2400. Specifically, a target layer may be formed to cover an entire portion of the spacer 2400 and portions of the underlying barrier layer 2300 exposed by the spacer 2400. The target layer may be formed of a material layer having an etch selectivity with respect to the spacer 2400 and the underlying barrier layer 2300. The target layer may be formed of a material layer which is different from the spacer 2400 and the underlying barrier layer 2300. The target layer may be formed of a dielectric material including a spin-on-carbon (SOC) layer, a silicon oxide ($SiO_2$) layer, a silicon nitride ($Si_3N_4$) layer or a silicon oxynitride (SiON) layer. Alternatively, the target layer may be formed of a material including a silicon material such as a polysilicon material. In some embodiments, the target layer may be formed of a conductive material.

The target layer may be recessed until a top portion of the spacer 2400 is exposed. As a result, the target pattern 2500 may be formed in an inside region surrounded by the spacer 2400 and in an outside region surrounding the spacer 2400. The target layer may be recessed using a planarization process such as an etch-back process or a chemical mechanical polishing (CMP) process. Since the target pattern 2500 is formed to fill the space region surrounded by the spacer 2400, the target pattern 2500 may have a reverse image of the spacer 2400.

The target pattern 2500 may be formed to include third line portions 2510 filling space regions between the second line portions 2410 of the spacer 2400, a first pad block portion 2520 filling the second open region (2421 of FIG. 29), and a second pad block portion 2530 filling the third open region (2430 of FIG. 29) surrounded by the spacer loop portion 2420. Each of the first and second pad block portions 2520 and 2530 may be divided into a plurality of pad portions in a subsequent process. A width of each of the third line portions 2510 in the horizontal direction may be less than a width of each of the first and second pad block portions 2520 and 2530 in the vertical direction. As described above, in some embodiments, the target layer may be formed of a conductive layer. Thus, the target pattern 2500 may be formed by depositing a conductive layer and by recessing the conductive layer. In such a case, the target pattern 2500 may be patterned for forming bit lines and bit line pads in a subsequent process.

Figure 33:
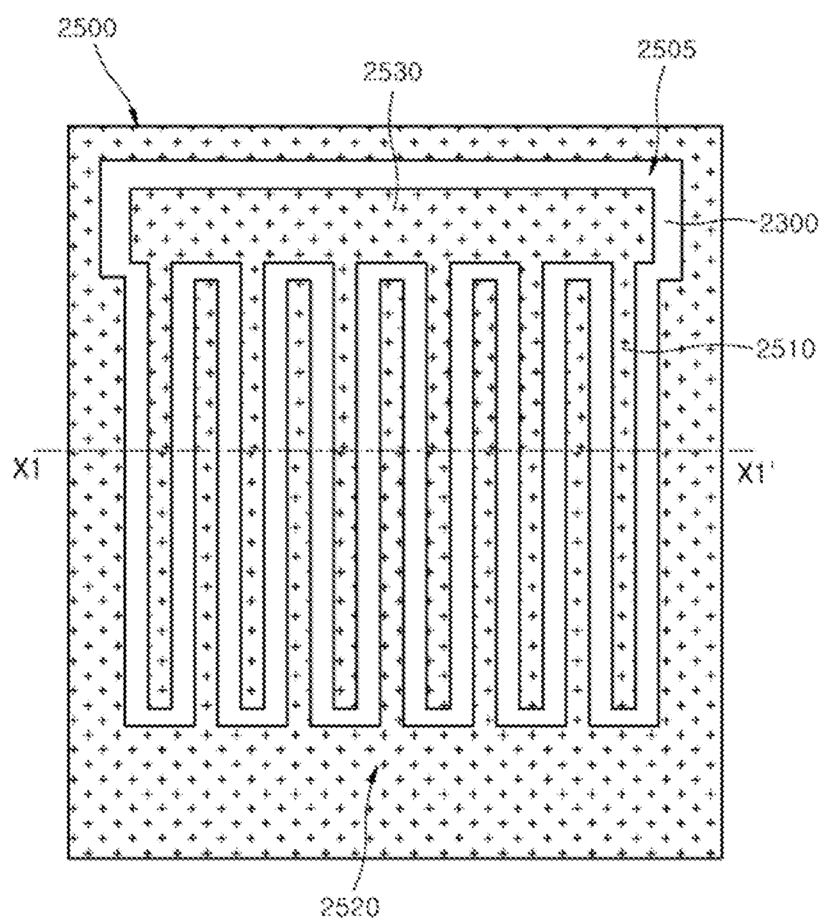
Figure 34:
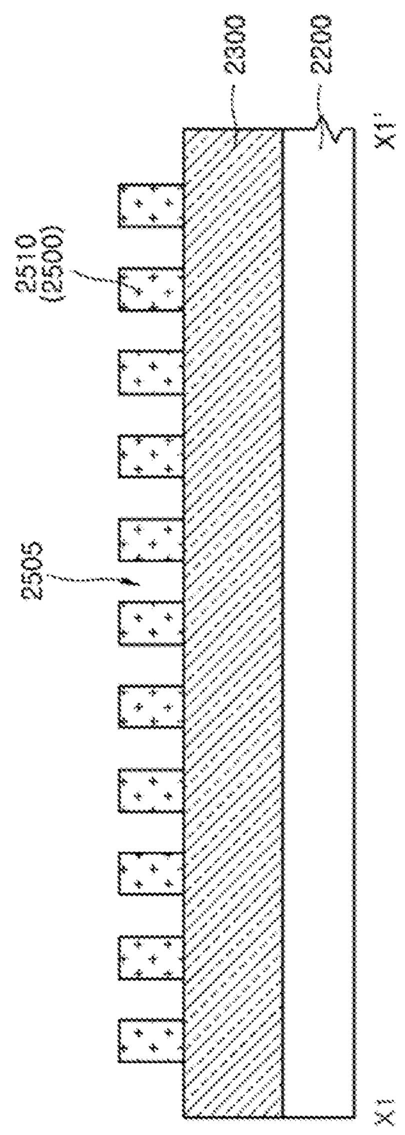

FIGS. 33 and 34 illustrate a step of exposing sidewalls of the target pattern 2500. FIG. 34 is a cross-sectional view taken along a line X-X' of a plan view shown in FIG. 33.

Referring to FIGS. 33 and 34, the spacer (2400 of FIGS. 31 and 32) may be selectively removed to expose sidewalls of the target pattern 2500 and a portion of the underlying barrier layer 2300. The spacer 2400 may be removed to provide a trench 2505.

Figure 35:
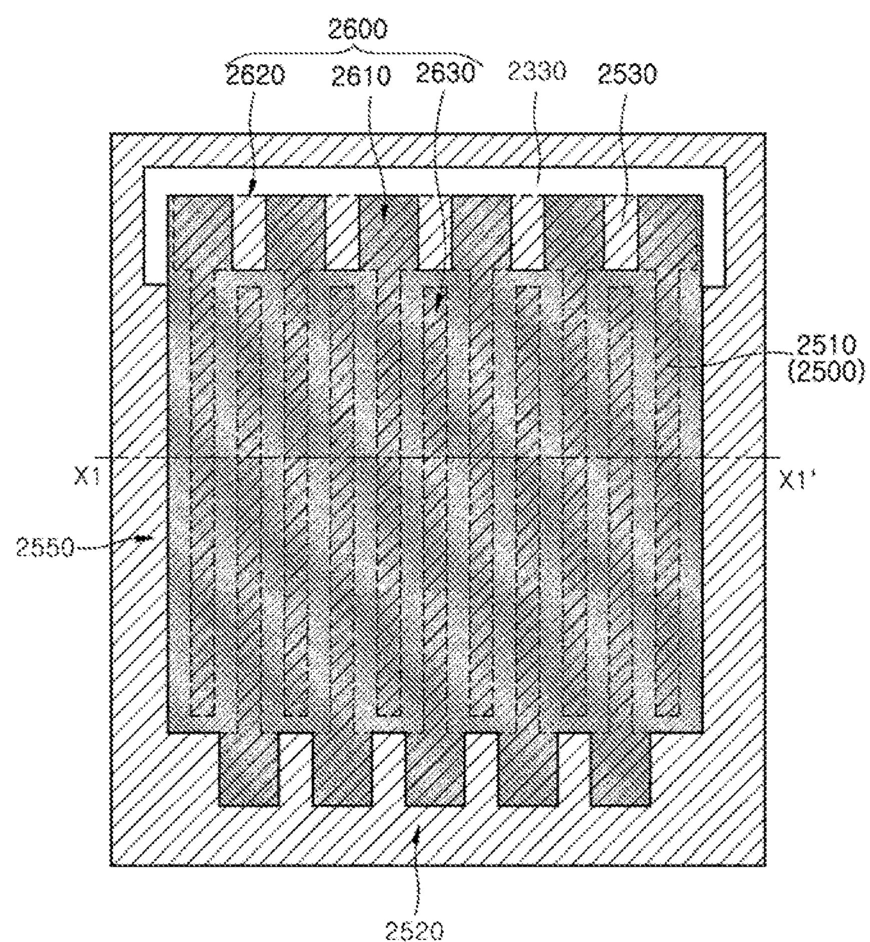
Figure 36:
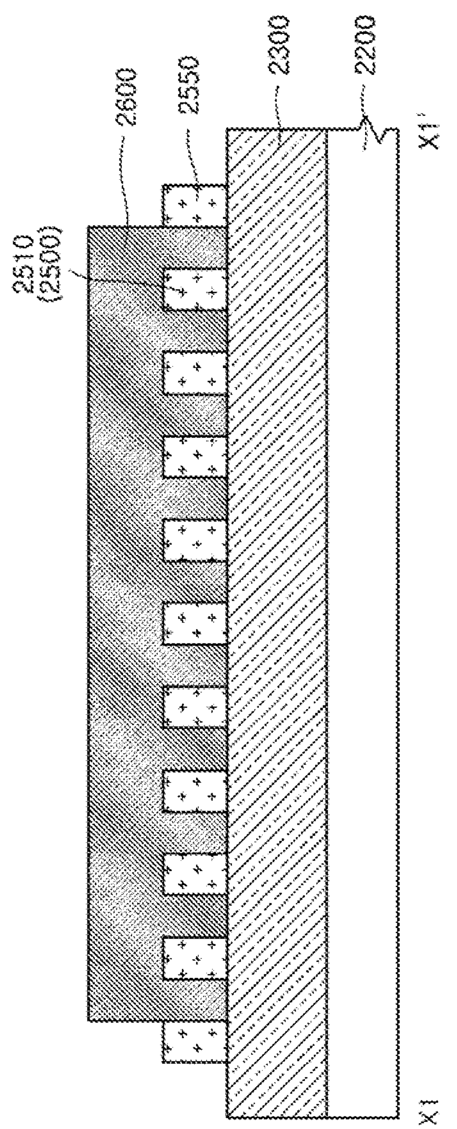

FIGS. 35 to 36 illustrate a step of forming a cut mask 2600. FIG. 36 is a cross-sectional view taken along a line X-X' of a plan view shown in FIG. 35.

Referring to FIGS. 35 and 36, the cut mask 2600 may be formed on the target pattern 2500 to expose some portions of the target pattern 2500. The cut mask 2600 may be formed to include a line/space region 2630 that covers the third line portions 2510 of the target pattern 2500 and space regions between the third line portions 2510. In addition, the cut mask 2600 may be formed to include open regions 2620 exposing some portions of the first and second pad block portions 2520 and 2530, and include some portions 2610 covering the other portions of the first and second pad block portions 2520 and 2530. The some portions 2610 of the cut mask 2600 may define pad portions. The cut mask 2600 may be formed by coating a photoresist layer on the target pattern 2500 to fill the trench 2505, by selectively exposing some portions of the photoresist layer, and by developing the exposed photoresist layer for forming a photoresist pattern corresponding to the cut mask 2600. When portions 2550 of the target pattern 2500 exposed by the cut mask 2600 are selectively removed, the third line portions 2510 of the target pattern 2500 may still remain.

Figure 37:
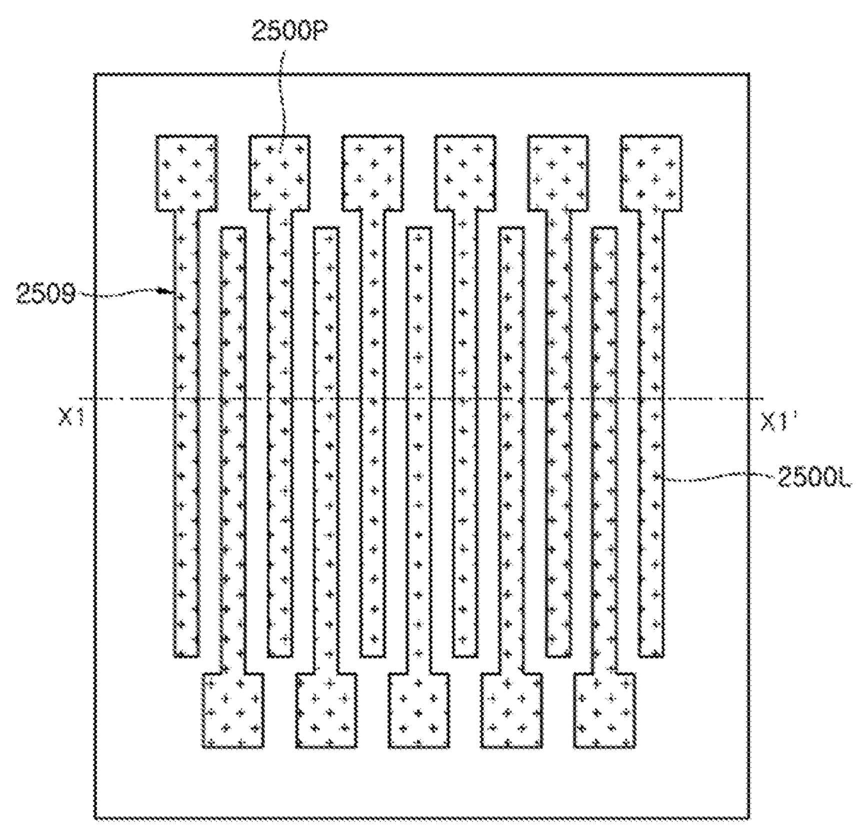
Figure 38:
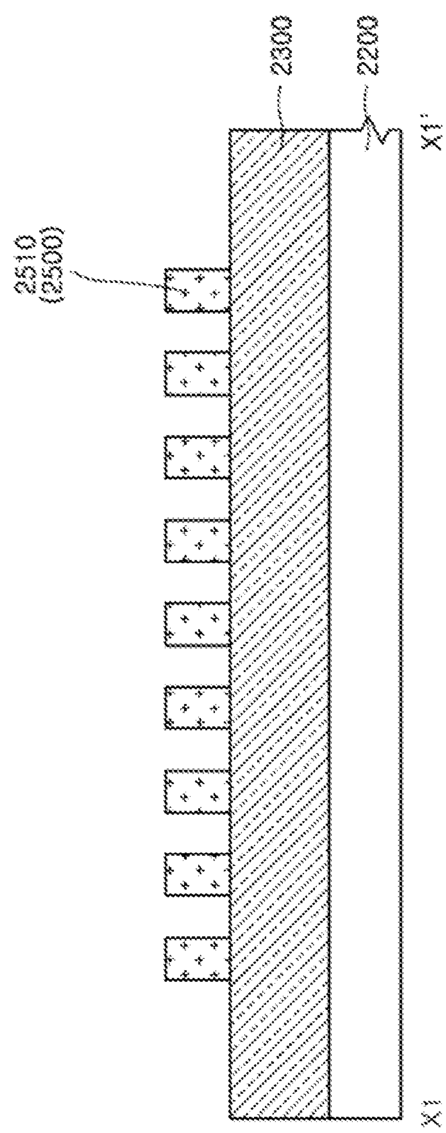

FIGS. 37 and 38 illustrate pad separation target patterns 2509. FIG. 38 is a cross-sectional view taken along a line X-X' of a plan view shown in FIG. 37.

Referring to FIGS. 37 and 38, the portions of the target pattern 2500 exposed by the cut mask 2600 may be selectively etched using the cut mask 2600 as an etch mask, thereby separating each of the first and second pad block portions 2520 and 2530 into a plurality of pad portions 2500P. Since the cut mask 2600 is formed to cover the third line portions 2510 and the space regions between the third line portions 2510, the third line portions 2510 may not be removed to provide line portions 2500L which are respectively connected to the pad portions 2500P during the etch process for separating each of the first and second pad block portions 2520 and 2530 into the plurality of pad portions 2500P. As a result, the pad separation target patterns 2509 may be formed by etching the target pattern 2500 using the cut mask 2600 as an etch mask, and each of the pad separation target patterns 2509 may include one of the pad portions 2500P and one of the line portions 2500L, which are connected to each other. Each of the pad portions 2500P may be connected to only one end of corresponding one of the line portions 2500L. The pad portions 2500P formed of the first pad block portion 2520 may be connected to even-numbered ones among the line portions 2500L, respectively. The pad portions 2500P formed of the second pad block portion 2530 may be connected to odd-numbered ones among the line portions 2500L, respectively.

Since the line/space region 2630 of the cut mask 2600 is connected to the portions 2610 of the cut mask 2600, occurrence of open failures between the line portions 2500L and the pad portions 2500P may be prevented during the pad separation process performed using the cut mask 2600 as an etch mask. The cut mask 2600 may be removed after the pad separation target patterns 2509 are formed. When the target pattern 2500 is formed of a conductive layer, the line portions 2500L of the pad separation target patterns 2509 may be used as bit lines and the pad portions 2500P of the pad separation target patterns 2509 may be used as bit line pads. According to the embodiment illustrated in FIGS. 25 to 38, the number of process steps may be reduced.

The methods according to the aforementioned embodiments and structures formed thereby may be used in fabrication of integrated circuit (IC) chips. The IC chips may be supplied to users in a raw wafer form, in a bare die form or in a package form. The IC chips may also be supplied in a single package form or in a multi-chip package form. The IC chips may be integrated in intermediate products such as mother boards or end products to constitute signal processing devices. The end products may include toys, low end application products, or high end application products such as computers. For example, the end products may include display units, keyboards, or central processing units (CPUs).

The embodiments of the present disclosure have been disclosed for illustrative purposes. Those skilled in the art will appreciate that various modifications, additions and substitutions are possible, without departing from the scope and or spirit of the present disclosure and the accompanying claims.

What is claimed is:

1. A method of forming fine patterns, the method comprising:

forming a partition on a base layer, wherein the partition includes a partition block portion, a first open region provided to face the partition block portion, and a plurality of first line portions extending in same direction and from a sidewall of the partition block portion toward the first open region so that ends of the first line portions are in contact with the first open region;

forming a spacer on sidewalls of the partition, wherein the spacer includes a spacer loop portion surrounding a second open region overlapping with the first open region, a plurality of second line portions on both sidewalls of each of the first line portions, first connection portions on sidewalls of the ends of the first line portions, and second connection portions on portions of the sidewall of the partition block portion between the first line portions;

removing the partition to expose a third open region corresponding to a region occupied by the partition block portion and to expose all of spaces between the second line portions;

forming a target pattern filling regions exposed by the spacer, wherein the target pattern includes third line portions filling the spaces between the second line portions, a first pad block portion filling the second open region, and a second pad block portion filling the third open region;

removing the spacer; and separating each of the first and second pad block portions into a plurality of pad portions.

2. The method of claim 1, wherein the ends of the first line portions are spaced apart from each other at regular intervals in a horizontal direction intersecting the first line portions.

3. The method of claim 1, wherein the first open region has a layout that is a reverse image of the partition block portion.

4. The method of claim 1, wherein the partition further includes a partition frame portion extending from the partition block portion to surround a line/space portion including the first line portions and spaces between the first line portions and to surround the first open region.

5. The method of claim 1, wherein the spacer includes a folded line portion having a tooth-shaped layout comprising of the first connection portions, the second connection portions and the second line portions which are connected in series.

6. The method of claim 1, wherein the first connection portions are spaced apart from each other at regular intervals in a horizontal direction intersecting the first line portions.

7. The method of claim 1, wherein the second connection portions are spaced apart from each other at regular intervals in a horizontal direction intersecting the first line portions.

8. The method of claim 1, wherein the first connection portions are offset along a horizontal direction intersecting the first line portions relative to the second connection portions.

9. The method of claim 1, wherein each of the third line portions has a smaller width in a horizontal direction than each of the pad portions.

10. The method of claim 1, wherein the pad portions are separated so that each of the pad portions is connected to one of both ends of corresponding one of the third line portions.

11. The method of claim 1, wherein the pad portions formed of the first pad block portion are connected to odd-numbered ones among the third line portions, respectively; and wherein the pad portions formed of the second pad block portion are connected to even-numbered ones among the third line portions, respectively.

12. The method of claim 1, wherein the separating of each of the first and second pad block portions includes:

forming a cut mask that covers the third line portions and exposes portions of each of the first and second pad block portions; and removing the portions of the first and second pad block portions exposed by the cut mask.

13. The method of claim 1, further comprising:

forming a conductive layer between the base layer and the partition; and transferring a pattern layout of the pad portions and the third line portions of the target pattern to the conductive layer for forming conductive patterns.

14. The method of claim 13, wherein the conductive patterns include bit lines corresponding to the third line portions and bit line pads corresponding to the pad portions.

15. A method of forming fine patterns, the method comprising:

forming a hard mask layer on a base layer;

forming a partition on the hard mask layer, wherein the partition includes a partition block portion, a first open region provided to face the partition block portion, and a plurality of first line portions extending in same direction and from a sidewall of the partition block portion toward the first open region so that ends of the first line portions are in contact with the first open region;

forming a spacer on sidewalls of the partition, wherein the spacer includes a spacer loop portion surrounding a second open region overlapping with the first open region, a plurality of second line portions on both sidewalls of each of the first line portions, first connection portions on sidewalls of the ends of the first line portions, and second connection portions on portions of the sidewall of the partition block portion between the first line portions;

removing the partition to expose a third open region corresponding to a region occupied by the partition block portion and to expose all of spaces between the second line portions;

transferring a pattern layout of the spacer to the hard mask layer for forming a hard mask, wherein the hard mask exposes a fourth open region overlapping with the second open region and a fifth open region overlapping with the third open region and to provide third line portions having the same planar layout as the second line portions;

forming a target pattern filling regions exposed by the hard mask, wherein the hard mask includes fourth line portions filling spaces between the third line portions, a first pad block portion filling the fourth open region, and a second pad block portion filling the fifth open region;

removing the hard mask; and separating each of the first and second pad block portions into a plurality of pad portions.

16. A method of forming fine patterns, the method comprising:

forming a partition on a base layer, wherein the partition includes a partition block portion, a first open region provided to face the partition block portion, and a plurality of first line portions extending from a sidewall of the partition block portion toward the first open region so that ends of the first line portions are in contact with the first open region;

forming a spacer on sidewalls of the partition, wherein the spacer includes a second open region overlapping with the first open region, a plurality of second line portions on both sidewalls of each of the first line portions, first connection portions on sidewalls of the ends of the first line portions, and second connection portions on portions of the sidewall of the partition block portion between the first line portions;

removing the partition to expose a third open region corresponding to a region occupied by the partition block portion and to expose all of spaces between the second line portions;

forming a conductive pattern filling regions exposed by the spacer, wherein the conductive pattern includes third line portions filling the spaces between the second line portions, a first pad block portion filling the second open region, and a second pad block portion filling the third open region; and separating each of the first and second pad block portions into a plurality of pad portions.

17. The method of claim 16, wherein the pad portions formed of the first pad block portion are connected to even-numbered ones among the third line portions, respectively; and wherein the pad portions formed of the second pad block portion are connected to odd-numbered ones among the third line portions, respectively.

18. The method of claim 16, further comprising:

forming a hard mask layer between the base layer and the partition; and transferring a pattern layout of the spacer to the hard mask layer for forming a hard mask.

19. The method of claim 16, wherein the conductive pattern is formed of a metal layer.

20. A method of forming fine patterns, the method comprising:

forming a partition on a base layer, wherein the partition includes a partition block portion, a first open region provided to face the partition block portion, and a plurality of first line portions extending from a sidewall of the partition block portion toward the first open region so that ends of the first line portions are in contact with the first open region;

forming a spacer on sidewalls of the partition, wherein the spacer includes a spacer loop portion surrounding a second open region overlapping with the first open region, a plurality of second line portions on both sidewalls of each of the first line portions, first connection portions on sidewalls of the ends of the first line portions, and second connection portions on portions of the sidewall of the partition block portion between the first line portions;

removing the partition to expose a third open region corresponding to a region occupied by the partition block portion and to expose all of spaces between the second line portions;

forming a target pattern filling regions exposed by the spacer, wherein the target pattern includes third line portions filling the spaces between the second line portions, a first pad block portion filling the second open region, and a second pad block portion filling the third open region; and separating each of the first and second pad block portions into a plurality of pad portions, wherein together the partition block portion and the first line portions have a comb-shaped layout in a plan view.

* * * * *